United States Patent
Erlat et al.

(10) Patent No.: US 8,034,419 B2
(45) Date of Patent: Oct. 11, 2011

(54) METHOD FOR MAKING A GRADED BARRIER COATING

(75) Inventors: Ahmet Gun Erlat, Clifton Park, NY (US); Anil Duggal, Niskayuna, NY (US); Min Yan, Ballston Lake, NY (US); Sheila Tandon, Niskayuna, NY (US); Brian Joseph Scherer, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 216 days.

(21) Appl. No.: 12/325,827

(22) Filed: Dec. 1, 2008

(65) Prior Publication Data
US 2009/0297813 A1    Dec. 3, 2009

Related U.S. Application Data

(63) Continuation-in-part of application No. 12/124,548, filed on May 21, 2008, which is a continuation of application No. 10/879,468, filed on Jun. 30, 2004, now Pat. No. 7,449,246.

(51) Int. Cl.
*H05H 1/24* (2006.01)
(52) U.S. Cl. ....... 427/569; 427/571; 427/577; 427/96.6; 427/108; 204/192.1
(58) Field of Classification Search .............. 427/569, 427/577, 585, 586, 595, 255.28, 249.1, 96.1, 427/108, 122, 126.1, 571, 96.6; 204/192.1
See application file for complete search history.

(56) References Cited

U.S. PATENT DOCUMENTS

| | | | |
|---|---|---|---|
| 3,932,693 A | 1/1976 | Shaw et al. |
| 4,540,763 A | 9/1985 | Kirchhoff |
| 4,552,791 A | 11/1985 | Hahn |
| 4,861,671 A | 8/1989 | Muchnik et al. |
| 5,051,308 A | 9/1991 | Reed et al. |
| 5,185,391 A | 2/1993 | Stokich |
| 5,462,779 A | 10/1995 | Misiano et al. |
| 5,654,084 A | 8/1997 | Egert |
| 5,683,757 A | 11/1997 | Iskanderova et al. |
| 5,714,838 A | 2/1998 | Haight et al. |
| 5,736,207 A | 4/1998 | Walther et al. |
| 5,757,126 A | 5/1998 | Harvey et al. |

(Continued)

FOREIGN PATENT DOCUMENTS
EP    0026973    5/2000
(Continued)

OTHER PUBLICATIONS

Jamarani, F., et al., "Compositionally graded thermal barrier coatings for high temperature aero gas turbine components". Surface and Coatings Technology, 54/55 (1992) pp. 58-63.*

(Continued)

*Primary Examiner* — Bret Chen
(74) *Attorney, Agent, or Firm* — Jean K. Testa

(57) ABSTRACT

Disclosed is a method relating to graded-composition barrier coatings comprising first and second materials in first and second zones. The compositions of one or both zones vary substantially continuously across a thickness of the zone in order to achieve improved properties such as barrier, flexibility, adhesion, optics, thickness, and tact time. The graded-composition barrier coatings find utility in preventing exposure of devices such as organic electro-luminescent devices (OLEDs) to reactive species found in the environment.

31 Claims, 24 Drawing Sheets

U.S. PATENT DOCUMENTS

| | | | |
|---|---|---|---|
| 5,922,481 A | 7/1999 | Etzbach et al. | |
| 5,923,970 A * | 7/1999 | Kirlin | 438/240 |
| 5,998,803 A | 12/1999 | Forrest et al. | |
| 6,023,371 A | 2/2000 | Onitsuka et al. | |
| 6,097,147 A | 8/2000 | Baldo et al. | |
| 6,198,217 B1 | 3/2001 | Suzuki et al. | |
| 6,268,695 B1 | 7/2001 | Affinito | |
| 6,291,116 B1 | 9/2001 | Wolk et al. | |
| 6,395,341 B1 | 5/2002 | Arakawa et al. | |
| 6,413,645 B1 | 7/2002 | Graff et al. | |
| 6,521,916 B2 | 2/2003 | Roberts et al. | |
| 6,522,067 B1 | 2/2003 | Graff et al. | |
| 6,558,219 B1 | 5/2003 | Burroughes et al. | |
| 6,576,351 B2 | 6/2003 | Silvernail | |
| 6,624,568 B2 | 9/2003 | Silvernail | |
| 6,642,092 B1 | 11/2003 | Voutsas et al. | |
| 6,642,652 B2 | 11/2003 | Collins, III et al. | |
| 6,703,780 B2 | 3/2004 | Shiang | |
| 6,777,871 B2 | 8/2004 | Duggal et al. | |
| 6,815,887 B2 | 11/2004 | Lee et al. | |
| 6,872,114 B2 | 3/2005 | Chung et al. | |
| 6,892,011 B2 | 5/2005 | Walker et al. | |
| 6,923,702 B2 | 8/2005 | Graff et al. | |
| 6,949,389 B2 | 9/2005 | Pichler et al. | |
| 7,015,640 B2 * | 3/2006 | Schaepkens et al. | 313/506 |
| 7,077,935 B2 | 7/2006 | Ziegler et al. | |
| 7,154,220 B2 | 12/2006 | Schaepkens et al. | |
| 7,166,366 B2 | 1/2007 | Moser | |
| 7,199,518 B2 | 4/2007 | Couillard | |
| 7,223,515 B1 | 5/2007 | Wolk et al. | |
| 7,413,982 B2 | 8/2008 | Levy | |
| 7,740,960 B1 * | 6/2010 | Zhu et al. | 428/699 |
| 2002/0142583 A1 * | 10/2002 | Chopra | 438/627 |
| 2003/0020085 A1 * | 1/2003 | Bour et al. | 257/101 |
| 2003/0194497 A1 | 10/2003 | Takada et al. | |
| 2004/0046497 A1 * | 3/2004 | Schaepkens et al. | 313/506 |
| 2004/0058157 A1 | 3/2004 | Ishikawa | |
| 2004/0219380 A1 | 11/2004 | Naruse et al. | |
| 2005/0051763 A1 | 3/2005 | Affinito et al. | |
| 2005/0082971 A1 | 4/2005 | Couillard | |
| 2005/0253509 A1 | 11/2005 | Schaepkens et al. | |
| 2005/0260395 A1 | 11/2005 | Schaepkens et al. | |
| 2006/0132032 A1 | 6/2006 | Schaepkens et al. | |
| 2006/0181669 A1 | 8/2006 | Schaepkens et al. | |
| 2006/0208634 A1 * | 9/2006 | Schaepkens et al. | 313/506 |
| 2006/0216410 A1 | 9/2006 | Schaepkens et al. | |
| 2007/0036887 A1 | 2/2007 | Haase et al. | |
| 2007/0077850 A1 | 4/2007 | Couillard | |
| 2007/0238311 A1 | 10/2007 | Levy | |
| 2008/0132050 A1 * | 6/2008 | Lavoie | 438/584 |
| 2009/0127462 A1 * | 5/2009 | Gunapala et al. | 250/338.4 |

FOREIGN PATENT DOCUMENTS

| | | |
|---|---|---|
| EP | 0181649 | 11/2001 |
| EP | 0182336 | 11/2001 |
| EP | 1062844 B1 | 10/2003 |
| GB | 2348316 A | 9/2000 |
| JP | 2003231765 A | 8/2003 |
| JP | 2004098525 | 4/2004 |
| WO | 9839497 | 9/1998 |
| WO | 2004025749 A2 | 3/2004 |
| WO | 2004073046 A2 | 8/2004 |
| WO | 2005025853 A1 | 3/2005 |
| WO | 2005043585 A2 | 5/2005 |
| WO | 2005051525 A1 | 6/2005 |
| WO | 2005122293 A2 | 12/2005 |
| WO | 2006016153 A1 | 2/2006 |
| WO | 2006071938 A1 | 7/2006 |
| WO | 2007021544 A2 | 2/2007 |
| WO | 2007109482 A2 | 9/2007 |

OTHER PUBLICATIONS

Hubner, R., et al., "Structure and thermal stability of graded Ta-TaN diffusion barriers between Cu and SiO2". Thin Solid Films 437 (2003), pp. 248-256.*

Otsuka, Y., et al., "Graded composition and valence states in self-forming barrier layers at Cu-Mn/SiO2 interface". Applied Physics Letters 96, 012101 (2010), pp. 1-3.*

Gao, J., et al., "Preparation of Continually Graded Barriers of YPrBaCuO for HTS Josephson Junctions". IEEE Transactions on Applied Superconductivity, vol. 11, No. 1, Mar. 2001, pp. 497-500.*

H. Suzuki et al., Near-Ultraviolet Electroluminescence from Polysilanes 331 Thin Solid Films 64-70 (1998).

Gijsbert Jan Meeusen, "Plasma Beam Deposition of Amorphous Hydrogenated Silicon," Thesis, University of Eindhoven, pp. 16-19 (1994).

Bastiaan Arie Korevaar, "Integration of Expanding Thermal Plasma Deposited Hydrogenated Amorphous Silicon in Solar Cells," Thesis, University of Eindhoven, pp. 23-34 (2002).

V.J. Law et al., "RF Probe Technology for the Next Generation of Technological Plasmas," J. Phys. D: Appl. Phys., 34, 2726-2733 (2001).

International Searching Authority, International Search Report for related PCT Application to U.S. Appl. No. 10/879,468.dated Aug. 28, 2007.

Akihiro Hashimoto, et al., "Properties of PECVD SiOxNy Films as Selective Diffusion Barrier," Jul. 1985, J. Electrochem. Soc.: Solid-State Science & Technology, vol. 133, No. 7, pp. 1464-1467.

M.I. Alayo, et al., On the nitrogen and oxygen incorporati on in plasma-enhanced chemical vapor deposition (PECVD) SiOxNy films, 2002, Thin Solid Films, vol. 402, pp. 154-161.

* cited by examiner

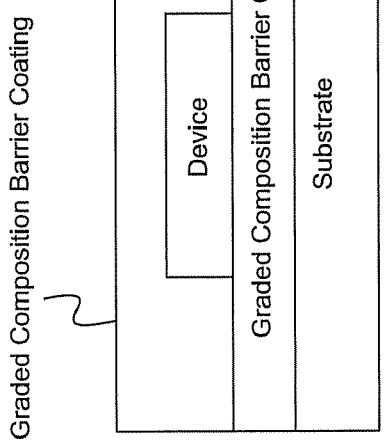
Figure 22
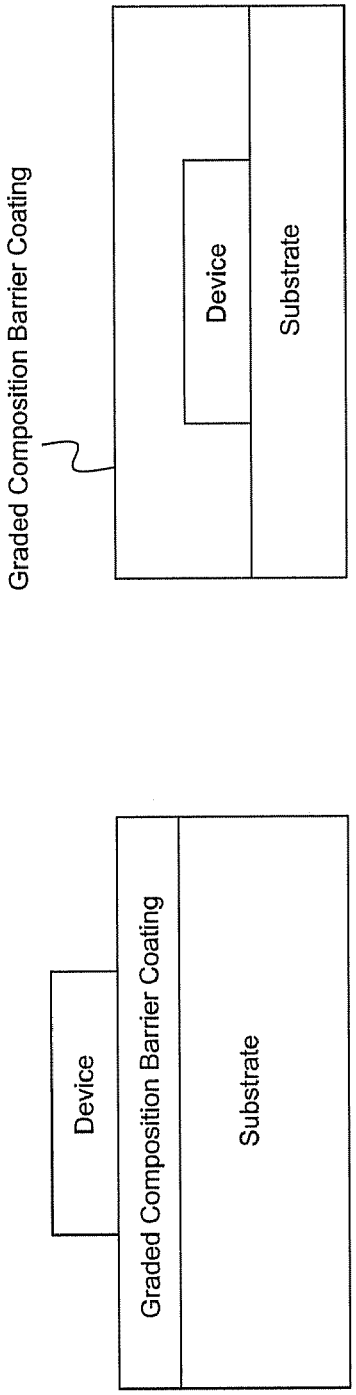
Figure 21
Figure 23

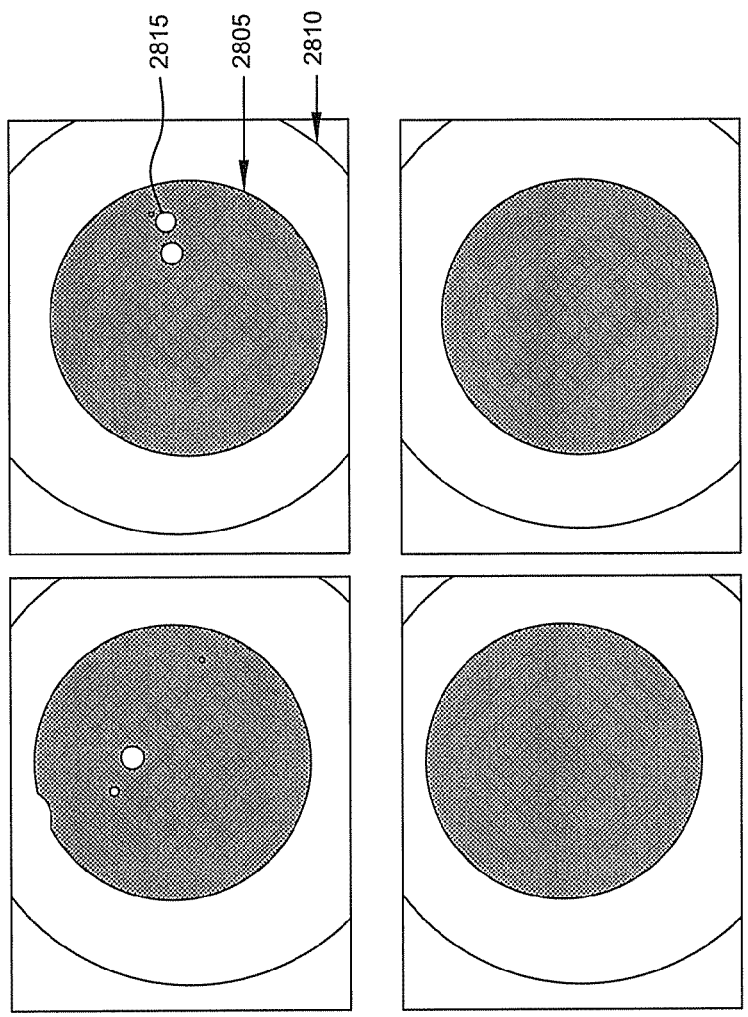

METHOD FOR MAKING A GRADED BARRIER COATING

RELATED APPLICATIONS

The present application is a continuation in part and claims priority benefit to copending and commonly assigned U.S. patent application Ser. No. 12/124,548 to Kim et al., filed May 21, 2008, entitled "Barrier Coatings", which is a continuation of U.S. patent application Ser. No. 10/879,468 to Kim et al., filed Jun. 30, 2004, now U.S. Pat. No. 7,449,246, each of which are hereby incorporated by reference. The present application is related to commonly assigned U.S. patent application Ser. No. 12/325,905, filed herewith, entitled "System and Method for Making a Graded Barrier Coating"; to U.S. Pat. No. 7,015,640 to Schaepkens et al., filed Sep. 11, 2002, entitled "Diffusion barrier coatings having graded compositions and devices incorporating the same;" and to U.S. patent application Ser. No. 10/988,481 to Kim et al., filed Nov. 15, 2004, entitled "High integrity protective coatings", each of which are hereby incorporated by reference.

STATEMENT REGARDING FEDERALLY SPONSORED RESEARCH & DEVELOPMENT

This invention was made with Government support under contract number RFP01-63GE awarded by United States Display Consortium and Army Research Laboratory. The Government may have certain rights in the invention.

BACKGROUND OF THE INVENTION

The invention relates generally to graded barrier coatings. More specifically, the invention relates to graded barrier coatings that are used with substrates, devices and the like.

Many devices are susceptible to reactive chemical species, such as oxygen or water vapor, normally encountered in the environment. Such devices are found in certain electrochromic devices, liquid crystal displays, organic light emitting diodes ("OLEDs"), light emitting diodes, photovoltaic devices, radiation detectors, medical diagnostic systems, integrated circuits, sensors, packaging and other components. Reference is made in this specification to non-limiting exemplary OLED embodiments; however, one of ordinary skill in the art will appreciate the applicability of the present invention to other devices and substrates.

EL devices, which may be classified as either organic or inorganic, are known in the graphic display and imaging arts. EL devices have been produced in different shapes for many applications. Inorganic EL devices, however, typically suffer from a required high activation voltage and low brightness. On the other hand, OLEDs, which have been developed more recently, offer the benefits of lower activation voltage and higher brightness in addition to simple manufacture, and, thus, the promise of more widespread application. The meaning of the acronym OLED herein is intended to include all variations of organic electroluminescence devices and their names, including, for example, light emitting polymers (LEP) and organic electroluminescence (OEL) devices.

Most organic electronic devices, especially OLEDs, are prone to rapid degradation when exposed to moisture and oxygen. Conventional OLEDs are built on transparent glass substrates that provide a low transmission rate of oxygen and water vapor. Glass substrates, however, are most suitable for rigid applications. Applicants have found manufacturing processes involving glass substrates to be relatively slow and costly in some circumstances. While plastic substrates provide flexibility, they are not impervious to oxygen and water vapor, and, thus, have provided insufficient protection for OLEDs.

In order to improve the resistance of these substrates to oxygen and water vapor, alternating layers of organic and inorganic compositions, including polymeric and ceramic materials have been applied to a surface of a substrate. In such multilayer barriers, a polymeric layer decouples defects in adjacent ceramic layers to reduce the transmission rates of oxygen and/or water vapor through the channels made possible by the defects in the ceramic layer. The interface between layers, however, may be weak and prone to delaminate.

The alternating layers discussed above commonly have different indices of refraction, normally resulting in degradation in optical transmission through the multiple layers. Prior approaches have focused on engineering the thickness of the layers to improve light transmission efficiency by taking advantage of multiple-interference patterns. One has to retain certain thickness of the layers, however, in order to maintain performance as a barrier. Furthermore, in a mass production environment it is difficult to achieve exact thickness control of the layers. Thus, engineering the thickness to accommodate optical transmission has presented certain challenges.

Current methods use glass or metal can encapsulation or glass or metal substrates, in combination with multi-layer coatings. While these methods may give good barriers, they have limited ability to satisfy the varying requirements for manufacturing of electronic devices, particularly optoelectronic devices, including both passive and active matrix OLEDs, bottom and top emission OLEDs, and both rigid and flexible devices. For example, for optical or optoelectrical devices, the coated barrier may be required to transmit, reflect or absorb light in a predefined manner. The coated barrier may be required to have certain qualities, such as having a certain flexibility, thickness, or durability. The coated barriers may further be required to adapt to different manufacturing needs such as barrier, tact time, OLED compatibility and yield. Traditional barriers have had a limited ability to provide the versatility required.

There remains a need for barriers that, in various embodiments, ameliorate or improve upon one or more of the deficiencies of the prior art.

SUMMARY

In a first aspect, an assembly and a method are disclosed that include a device and a graded-composition barrier coating that is disposed on a surface of the device. The coating includes a first zone defined by a first thickness having a first material and a second material wherein a composition of the first zone varies substantially continuously across the first thickness. The coating has a second zone defined by a second thickness which is substantially free of any of the first material.

In a second aspect, an assembly and a method are disclosed that include a substrate, an electronic device disposed on the substrate, and a graded-composition barrier coating disposed along a surface of the electronic device which is substantially transparent to visible light. The coating includes a first zone defined by a first thickness in which a composition of an inorganic material and a composition of an organic material each vary substantially continuously across the first thickness and wherein the first thickness is between approximately 5 nm and approximately 1000 nm. The coating further includes a second zone defined by a second thickness which is substantially free of any organic material. In one embodiment, the coating has an oxygen transmission rate less than approximately 0.01 cm$^3$/(m$^2$ day), as measured at 25° C. with a gas containing approximately 21 volume-percent oxygen and a water vapor transmission rate less than approximately 0.0001 g/(m$^2$ day), as measured at 25° C. with a gas having approximately 100-percent relative humidity.

In a third aspect, an assembly and a method are disclosed that include a device and a graded-composition barrier coating disposed on a surface of the device. The coating includes a first zone defined by a first thickness comprising a first material and a second material wherein a composition of the first zone varies substantially continuously across the first thickness and wherein a first percent composition of the first material is greater than or equal to a first percent composition of the second material. The coating further includes a second zone defined by a second thickness comprising the first material and the second material wherein a composition of the second zone varies substantially continuously across the second thickness and wherein a second percent composition of the second material is greater than or equal to a second percent composition of the first material.

In one embodiment, the first material may be organic and the second material may be inorganic. Alternatively, both materials may be inorganic. In other embodiments, the first material may be different from the second material. The materials may comprise organic, inorganic, ceramic, and combinations thereof. In various embodiments, the inorganic and ceramic materials are selected from the group consisting of: oxide, nitride, carbide, boride, and combinations thereof of elements of Groups IIA, IIIA, IVA, VA, VIA, VIIA, IB, and IIB, metals of Groups IIIB, IVB, and VB, and rare-earth metals. The organic materials may include polymer, parylene, an acrylic, a siloxane, xylene, an alkene, styrene, an organosilane, an organosilazane, an organosilicone, and combinations thereof. The inorganic materials may include metal oxide, metal nitride, silicon oxide, silicon nitride, metal oxynitride, silicon oxynitride, and combinations thereof.

In one embodiment, the second zone may comprise the second material. A percent atomic Carbon in the first zone may preferably not exceed approximately 90%. A percent atomic Carbon in the second zone may preferably not exceed approximately 5%. The first thickness may be between approximately 5 nm and approximately 1000 nm. In further embodiments, the first zone and second zone may be contiguous.

In various embodiments, the device may be an electrochromic device, a liquid crystal display, an organic light emitting diode, a light emitting diode, a photovoltaic device, a radiation detector, an integrated circuit, a sensor, a component of a medical diagnostic system and combinations thereof. In one embodiment, the coating may be substantially transparent.

Several embodiments may include a substrate disposed on the device, on the coating, or on both. The substrate may be substantially flexible. The substrate may be substantially transparent. The substrate may comprise plastic, glass or metal. In various embodiments, the device is encapsulated by the coating or by the coating and the substrate.

In several embodiments, the coating may have an oxygen transmission rate less than approximately 0.01 cm$^3$/(m$^2$ day), as measured at 25° C. with a gas containing approximately 21 volume-percent oxygen. The coating may also have a water vapor transmission rate less than approximately 0.0001 g/(m$^2$ day), as measured at 25° C. with a gas having approximately 100-percent relative humidity.

The graded-composition barrier coating may have a zone of continuously varying composition. The zone may prefer-ably decouple defects in adjacent zones and may comprise an organic material. The organic zone may be fully graded to contribute to barrier enhancement. Disclosed embodiments may provide better control of gradation, thereby improving coating properties such as barrier performance, tact time, compatibility, adhesion, optics, process time, thickness or encapsulation. Such graded-composition barrier coatings may contain continuously graded zones that decouple defects while contribute to the performance of the coating.

BRIEF DESCRIPTION OF THE DRAWINGS

FIG. 21 is a schematic cross-sectional view of a substrate, graded-composition barrier coating and device according to an embodiment of the present invention.

FIG. 22 is a schematic cross-sectional view of a substrate, graded-composition barrier coating and device according to an embodiment of the present invention.

FIG. 23 is a schematic cross-sectional view of a substrate, graded-composition barrier coating and device according to an embodiment of the present invention.

FIG. 28 is a Calcium test result for the graded-composition barrier coating shown in FIG. 8 used in combination with a plastic substrate.

DETAILED DESCRIPTION

Figure 1:
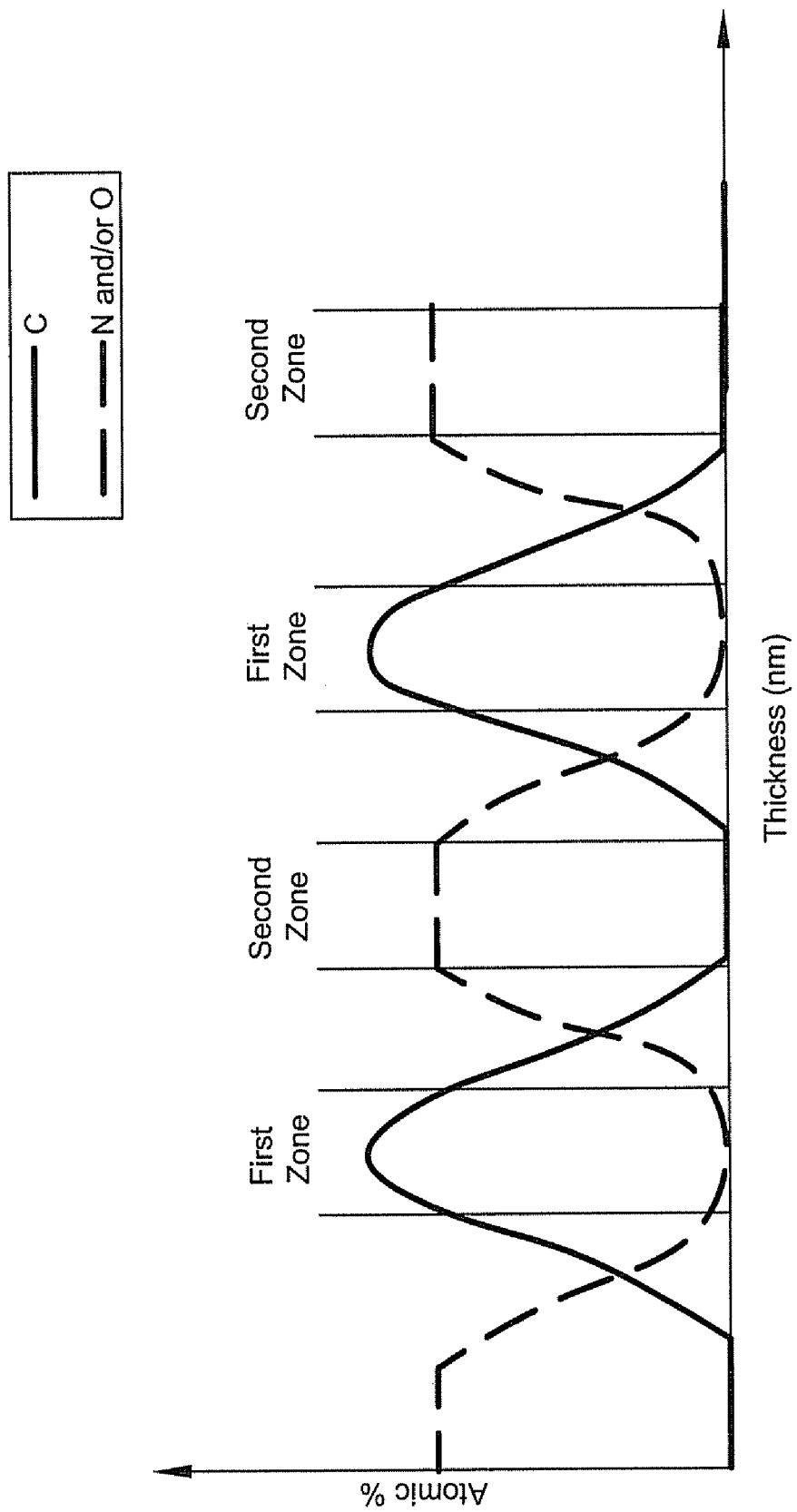
FIG. 1 is a graph of a graded-composition barrier according to an embodiment of the present invention.

Various embodiments of the present invention will now be described with reference to the figures. Like reference numerals refer to like elements. One of ordinary skill in the art will appreciate the applicability of the teachings of the detailed description to other embodiments falling within the scope of the appended claims and equivalents thereto.

The graded-composition barrier coatings of the present invention find utility in a variety of applications including coating on substrates and devices to protect from moisture or oxygen ingress. Organic light-emitting material and/or cathode materials in OLEDs are particularly susceptible to attack by reactive species existing in the environment, such as oxygen, water vapor, hydrogen sulfide, $SO_x$, $NO_x$, solvents, etc. Films having a graded-composition barrier coating are useful to extend the life of these devices and render them more commercially viable.

Figure 2:
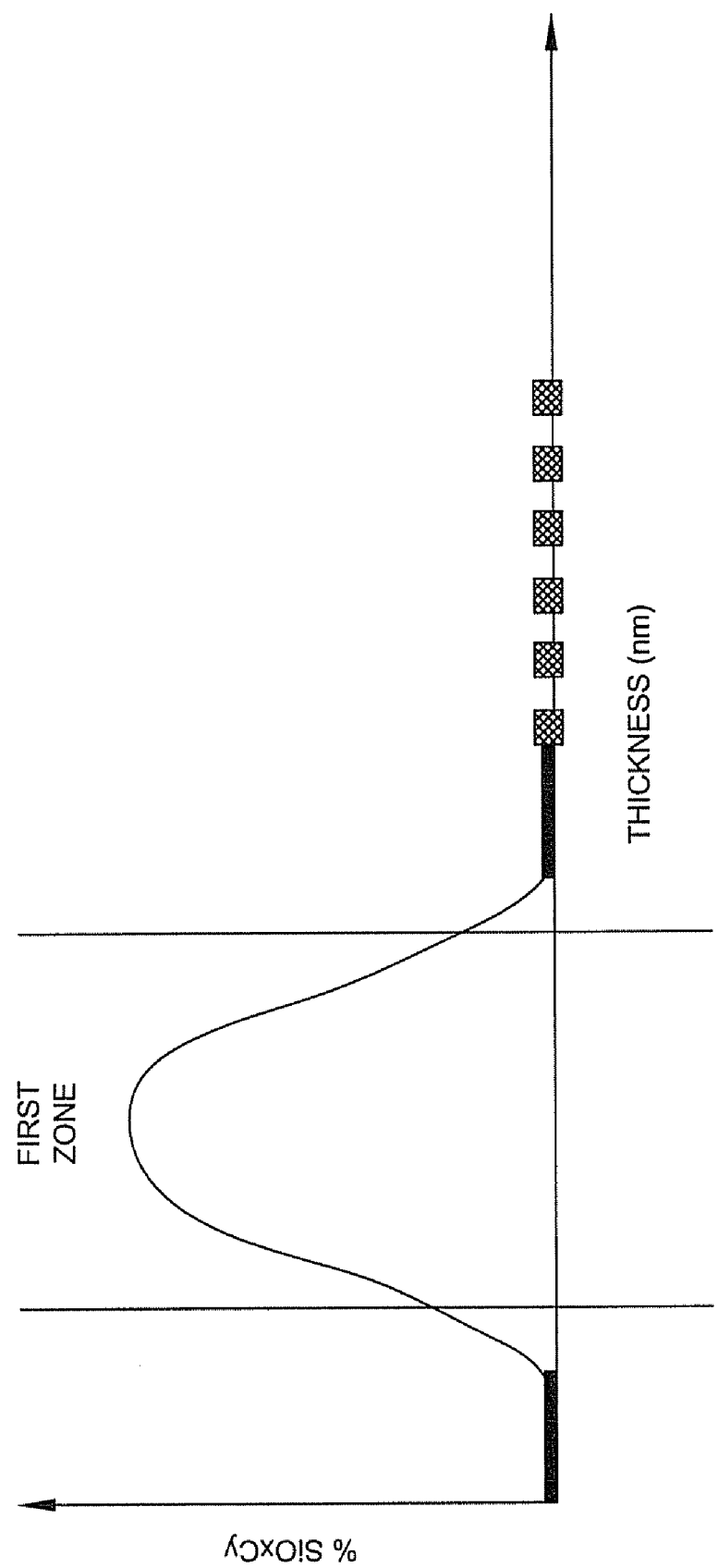
FIG. 2 is a graph of a graded-composition barrier according to an embodiment of the present invention.

FIGS. 1 and 2 show embodiments of a graded-composition barrier coating according to one aspect of the present invention. As depicted, a first zone has a composition that varies substantially continuously across its thickness. Referring to FIG. 1, the composition of the first zone varies substantially continuously in terms of the percent atomic Carbon present at each successive thickness. In FIG. 2, the composition of the first zone varies substantially continuously in terms of the percentage of organic material, such as SiOxCy, present at each successive thickness. In certain circumstances, first zones like those depicted in FIGS. 1 and 2 may have a predominant amount of organic material, and thus be called an organic zone. As one of ordinary skill will appreciate, percent atomic Carbon typically approximates the amount of organic material present, but not necessarily so.

Continuously changing the composition of a first zone, for example an organic zone, could lead to substantial improvements in barriers. For example, fully organic layers or zones may not be necessary to achieve superior barrier performance. Rather, in some applications, organic layers or zones may have been excessively thick with limited benefit. By fully grading an organic zone, the thickness of a graded-composition barrier coating could be reduced without loss of certain performance in terms of decoupling of defects and overall barrier performance. By fully grading such a zone, the zone may provide barrier functionality in addition to decoupling defects of adjacent zones. For example, fully grading a first zone with SiOxCy allows for enhancements in barrier, adhesion, and optical performance, with potentially added benefit of reductions in process time due to a reduced thickness from conventional organic zones. Further advantages are obtainable as described below.

In FIGS. 1 and 2, the composition of a first material in a first zone may be kept below a local maximum. For organic material in an organic zone, the local maximum may be determined for contributing to barrier performance while still performing other functions such as decoupling defects in adjacent zones. For example, the grading of the zone may preferably have a percentage of organic material less than 90%. In other embodiments, the local maxima can be measured in terms of percent atomic Carbon and be kept below 90%, or preferably less than 80%. Local maximas at lower Carbon values may be used according to the needs of a particular embodiment.

Coating Compositions

Due to the graded nature of the zones described herein, it will be appreciated that the terms "organic zone" or "inorganic zone" may refer to thicknesses of coating in which both organic and inorganic materials may be present. Generalizing the principles taught herein, a first zone need not be organic at all. For example, gradations of one inorganic material may be suitable to decouple the defects of gradations of another inorganic material. One inorganic material may contribute both to barrier performance and decoupling of defects in adjacent zones. One of ordinary skill will also appreciate that as a zone becomes more extensively graded, the zone may become less clearly organic or inorganic. The same is true of zones comprising other subcategories of materials, such as polymers and ceramics.

Indeed, any suitable first and second material may be selected, so long as their compositions are different and varied as described herein to form a graded-composition barrier coating. Examples of such differing materials are described below. Typically the materials may be selected and the zones graded such that one of the zones provides superior barrier performance while the other zone both decouples the defects of the adjacent zones and contributes to barrier performance. One of ordinary skill will also appreciate that while reference is typically made to two materials and two zones here, the invention is not so limited. For example, see FIG. 27. Indeed, embodiments of the present invention may have two or more zones comprising two or more materials.

The term "composition" appears in various contexts. For example, the Silicon Oxycarbide represented in FIG. 2 is an organic material that has a composition in the elemental sense. The elemental composition refers to the amount and proportion of Silicon, Oxygen, and Carbon in the SiOxCy. In certain embodiments, the elemental composition of such a material may change continuously while the proportion of the organic material SiOxCy in the zone may remain constant. A zone of a coating may also be described as having a composition in the bulk sense. For example, in FIG. 2, the first zone has a composition of the organic material SiOxCy and an inorganic material. In the bulk context, the proportion of organic to inorganic material may continuously change across a thickness of the zone, while the elemental composition of each material remains constant. In either case, one may describe the composition as changing continuously. The present invention encompasses all of these meanings as applicable in a given context.

Making a Graded-Composition Barrier Coating

Figure 3:
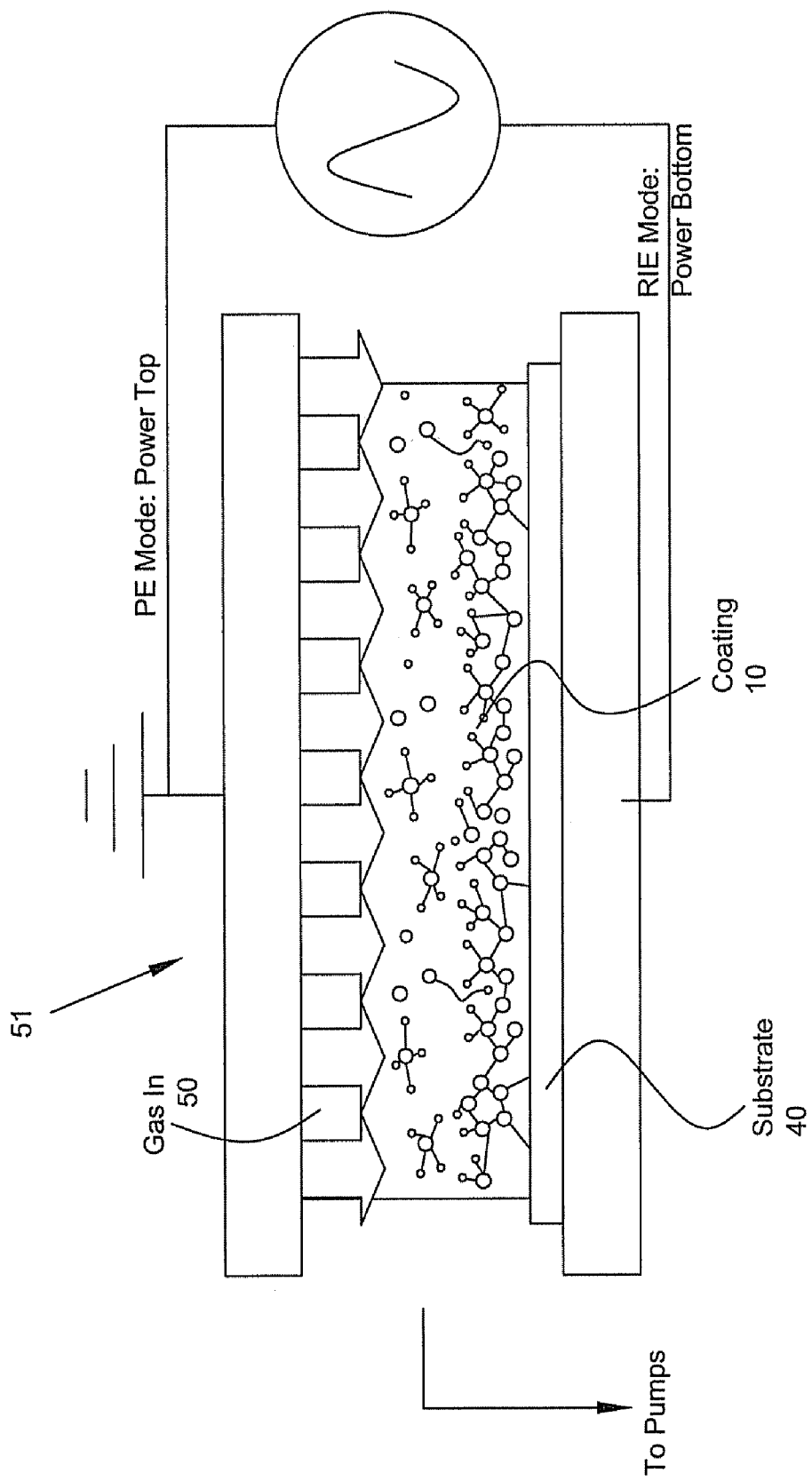
FIG. 3 is a schematic illustration of a plasma-enhanced chemical vapor deposition chamber according to an embodiment of the present invention.

With reference to FIG. 3, a graded-composition barrier coating 10 of the present invention may be made by depositing precursors 50 of reaction or recombination products of reacting species onto a substrate 40 or film. A graded composition is obtained by changing the compositions of the precursor gases 50 fed into the reactor chamber 51 during the deposition of reaction products to form the coating. Varying the relative supply rates or changing the identities of the reacting species results in a coating 10 that has a graded composition across its thickness. By depositing a graded composition, the graded-composition barrier coating does not have distinct interfaces at which the composition of the coating changes abruptly. Graded changes in composition can reduce or eliminate potential for delamination.

The rate of introduction of a given precursor 50 into the chamber may be controlled automatically by a controller 53 not shown. Any controller that can control simultaneous predetermined changes in the rate of introduction of a plurality of precursors is suitable.

For example, silicon carbide can be deposited onto a substrate from plasmas generated from silane (SiH4) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as tetraethoxysilane (TEOS), vinyl trimethylsilane (VTMS), hexamethyldisiloxane (HMDSO), hexamethyldisilazane (HMDSN), or octamethylcyclotetrasiloxane (D4). Silicon nitride can be deposited from plasmas generated from silane and ammonia. Aluminum oxycarbonitride can be deposited from a plasma generated from a mixture of aluminum tartrate and ammonia. Other combinations of reactants may be chosen to obtain a desired coating composition. Following the teachings of the present application, the choice of the particular reactants is within the skill of the ordinary artisan.

Figure 5:
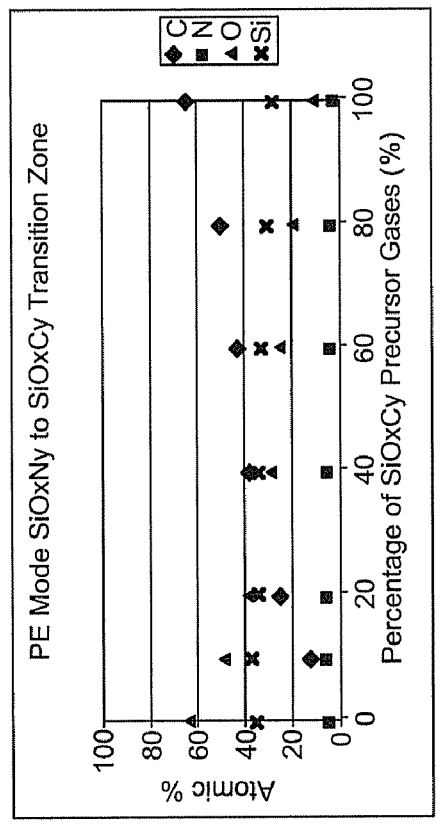
FIG. 5 is an XPS plot for a portion of a graded-composition barrier coating according to an embodiment of the present invention.
Figure 4:
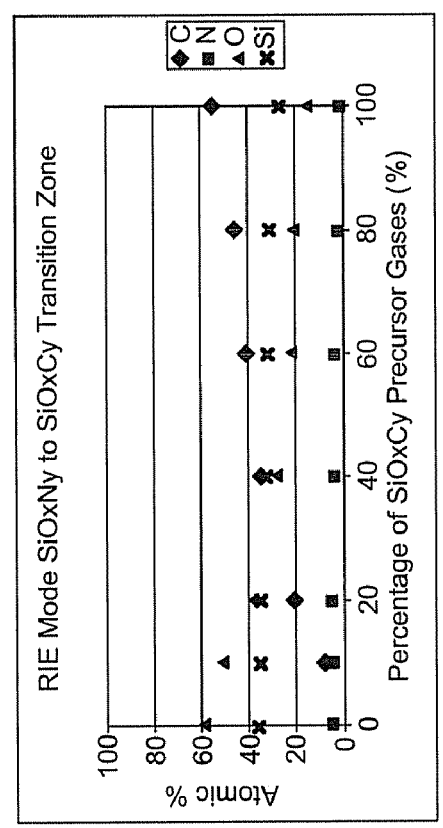
FIG. 4 is an X-ray photoelectron spectroscopy (XPS) plot for a portion of a graded-composition barrier coating according to an embodiment of the present invention.
Figure 7:
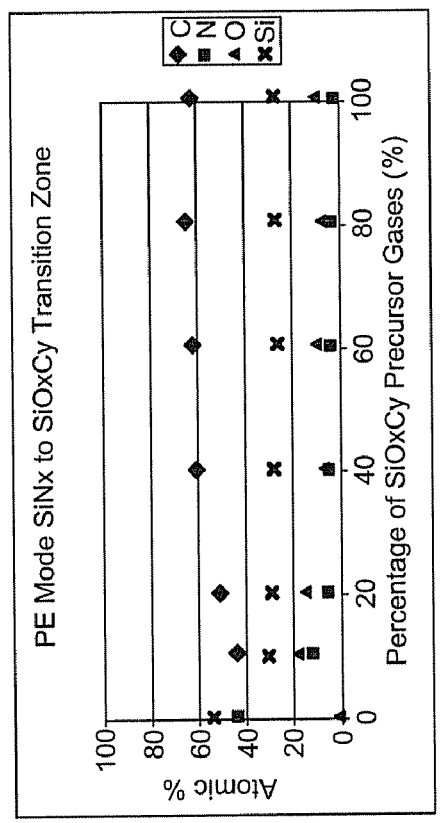
FIG. 7 is an XPS plot for a portion of a graded-composition barrier coating according to an embodiment of the present invention.
Figure 6:
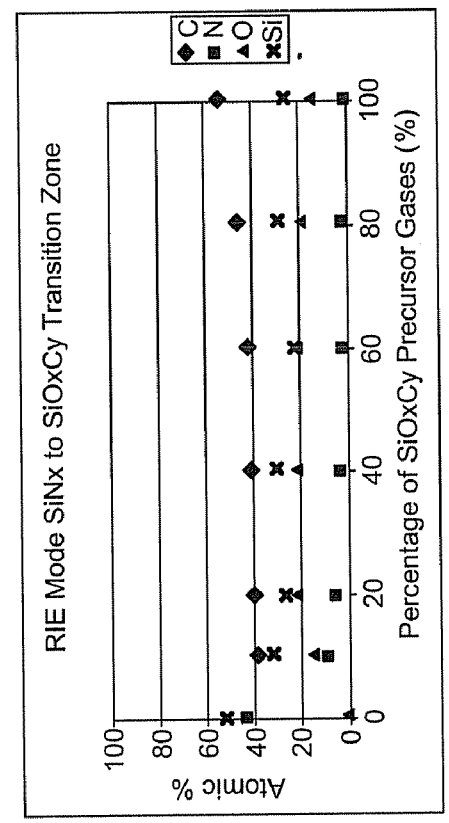
FIG. 6 is an XPS plot for a portion of a graded-composition barrier coating according to an embodiment of the present invention.

In FIGS. 4-7, graphs of the elemental compositions change from an inorganic zone to a Silicon Oxycarbide zone as a function of the percentage of Silicon Oxycarbide precursor gases. The graphs were developed using X-ray photoelectron spectroscopy (XPS). FIGS. 4 and 6 illustrate coatings formed using a RIE mode technique, whereas FIGS. 5 and 7 illustrate coatings formed using a PE mode deposition technique. The inorganic zone in FIGS. 4 and 5 is Silicon Oxynitride, whereas the inorganic zone in FIGS. 6 and 7 is Silicon Nitride.

As shown by FIGS. 4-7, the elemental change in composition between the zones depends not only on the precursor gas concentration, but on the particular mode and deposition technique used to make the coating. In forming a particular graded-composition barrier coating, one may thus empirically determine the relationship of precursor gases to the resulting elemental composition of the coating in a transition between two zones for a given technique. From the empirical data, one may then adapt a controller 53 to automatically generate graded-compositions having a desired grading.

Figure 8:
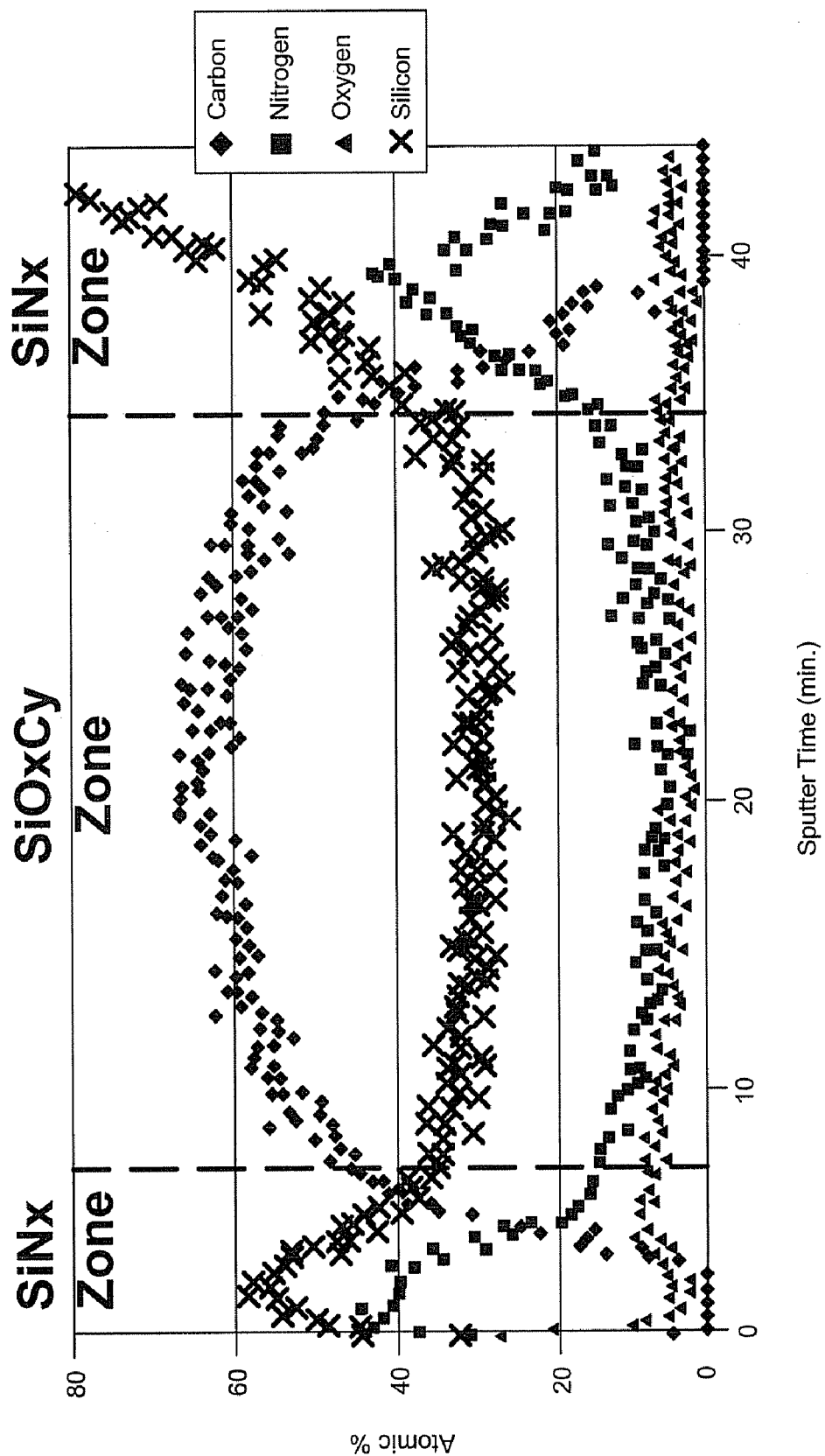
FIG. 8 is an XPS plot for a SiNx and SiOxCy graded-composition barrier coating according to an embodiment of the present invention.

Referring now to FIG. 8, an XPS depth profile depicts a graded-composition barrier coating with two SiNx zones and an intermediate SiOxCy zone. As depicted in the other XPS depth profiles, sputter time is proportional to coating thickness. The graded-composition barrier coating depicted in FIG. 8 was formed using the empirical findings in FIG. 7 as a basis. As shown, the percent atomic Carbon changes substantially continuously across the thickness of the SiOxCy zone. Percent atomic carbon remains below about 70%. N is present across the thickness of the SiOxCy zone. The amount of Carbon decreases continuously as the composition transition into the SiNx zone until the percent atomic Carbon is essentially zero. The SiNx zone is then substantially free of SiOxCy, providing excellent barrier properties. For example, FIG. 28 shows test results for the graded-composition barrier coating depicted in FIG. 8. FIG. 28 recreates four photographs of calcium samples 2805 protected by a combination 2810 of the graded-composition barrier coating and a plastic substrate. The samples were exposed to 90% relative humidity at 60° C. for 500 hours. The lower two samples show no signs of transmission of water or oxygen to the Calcium. While the small circles 2815 in the upper two samples indicate some limited water or oxygen transmission, the samples show excellent barrier properties overall.

The resulting graded-composition barrier coating can provide improved resistance to delamination. The presence of SiNx in the SiOxCy zone provides the SiOxCy zone with barrier properties in addition to decoupling defects of the SiNx zones. The continuously changing composition of the SiOxCy zone may allow improved adaptation for structural requirements such as optics, flexibility, thickness, and processing time.

Testing of a five zone version of the three zone graded-composition barrier coating depicted in FIG. 8 demonstrated superior barrier performance. Calcium encapsulated by the five zone graded-composition barrier coating showed no significant transmission of water or oxygen after 549 hours exposure to 90% relative humidity at 60° C.

Figure 9:
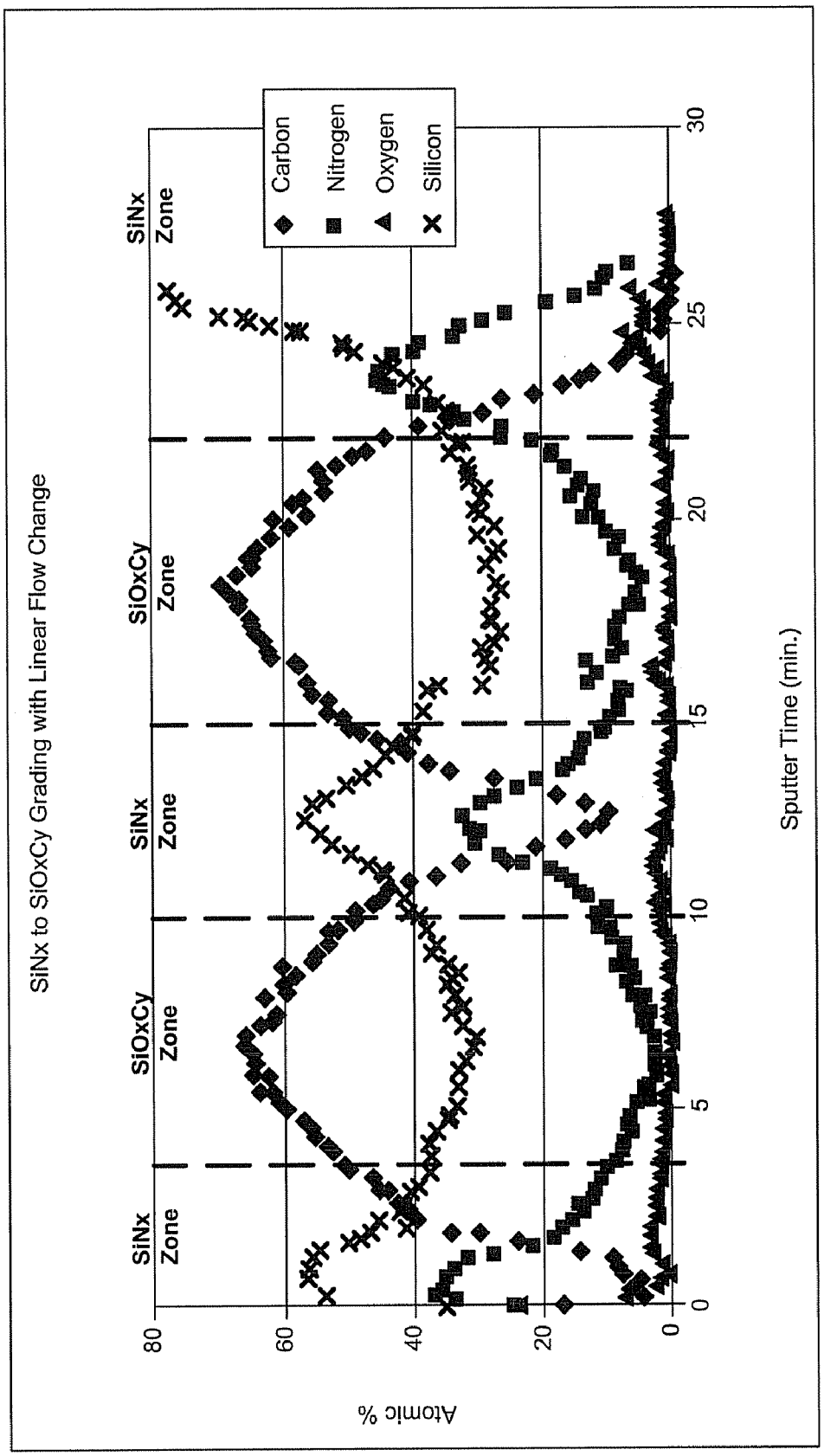
FIG. 9 is an XPS plot for a SiNx and SiOxCy graded-composition barrier coating according to an embodiment of the present invention.

Referring to FIG. 9, an XPS depth profile depicts a graded-composition barrier coating having a plurality of SiNx zones with intermediate SiOxCy zones. The graded-composition barrier coating depicted in FIG. 9 was formed using the empirical findings in FIG. 10 as a basis. As shown, the percent atomic Carbon changes substantially continuously across the thickness of the coating. Percent atomic carbon remains below maximas of about 70%. SiNx is present across the thickness of the SiOxCy zones. The percent atomic Carbon decreases as the composition transitions into the SiNx zones. In one SiNx zone, Carbon decreases to about 10%, in another to about 5%, and in yet another to about 0%. The SiNx zones may thus be substantially free of SiOxCy, providing for high barrier zones with versatile properties. In this embodiment, the elemental compositions of the zones change substantially continuously across their thicknesses.

Note that in several of the XPS figures, including FIG. 8, the percent atomic Silicon appears to trend toward a maximum at the maximum sputter time. The percent atomic Silicon shown is artificially high in that region due to interference from the Silicon wafer used as the substrate.

Figure 10:
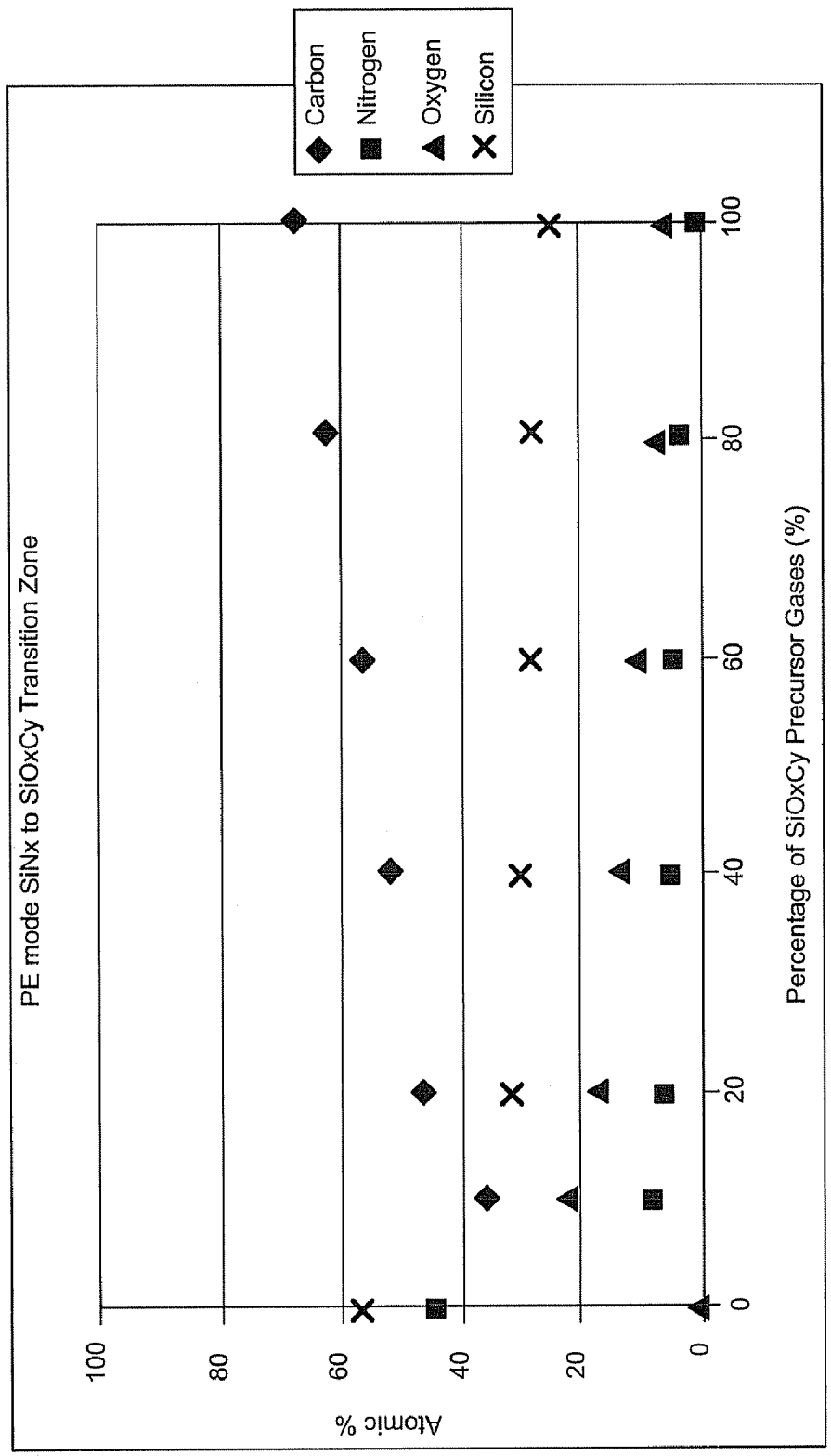
FIG. 10 is an X-ray photoelectron spectroscopy (XPS) plot for a portion of the graded-composition barrier coating of FIG. 9.

Referring to FIG. 10, a XPS graph of the elemental composition shows the change to a Silicon Oxycarbide zone in the graded composition barrier of FIG. 9. The deposition mode was PE. [May need to swap FIGS. 9 and 10 in order—see comments above]

Figure 11:
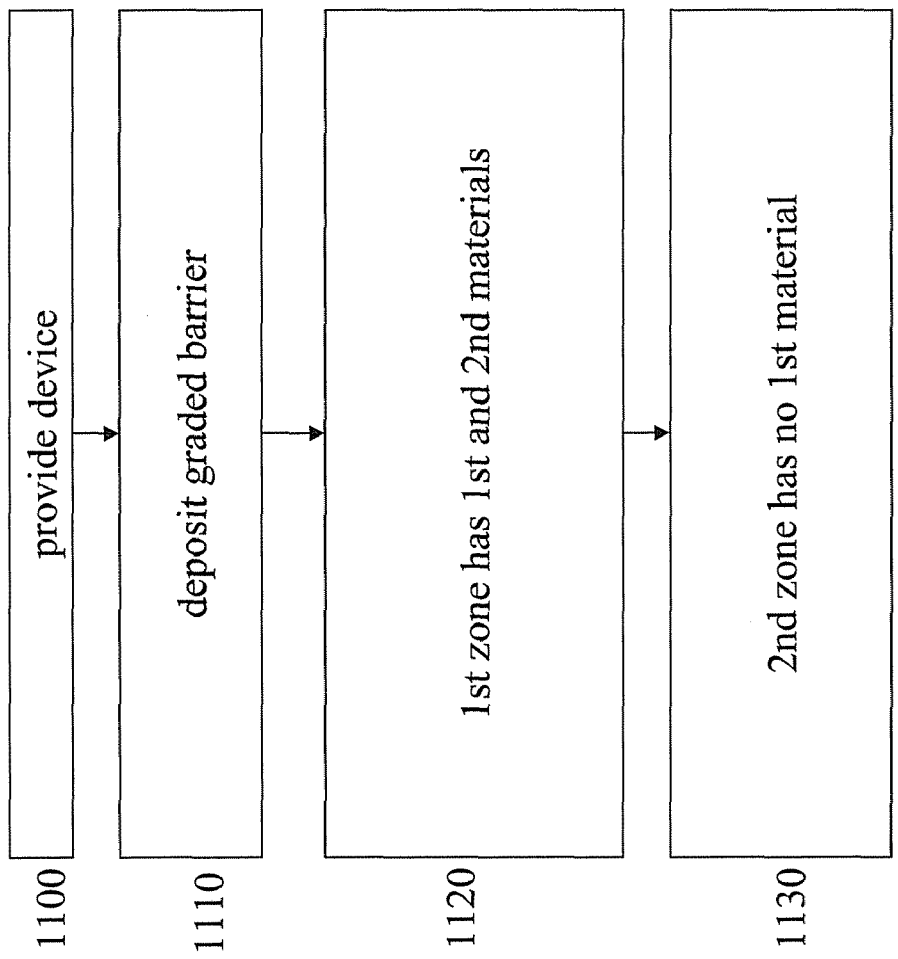
FIG. 11 is a flow chart according to an embodiment of the present invention.

Referring to FIG. 11, the flow chart illustrates an embodiment of the present invention implemented in steps 1100-1130. Step 1100 includes providing a device having a surface. The device may include electronic devices such as an OLED, and may also include less conventional devices such as a film as may be used to create high barrier packaging. In step 1110, a graded-composition barrier coating is deposited on the surface of the device. Any suitable process may be used to deposit the coating. In step 1120, the graded-composition barrier coating is deposited to have a first zone defined by a first thickness comprising first and second materials wherein a composition of the first zone varies substantially continuously across the first thickness. Preferably, the first zone may decouple defects in the second zone. The first zone may also contribute to the barrier performance of the graded-composition barrier coating. In step 1130, the graded-composition barrier coating is deposited to have a second zone defined by a second thickness which is substantially free of any of the first material. Preferably, the second zone may provide optimal barrier properties. The graded-composition barrier coating thus formed may improve structural, optical and process demands of various graded-composition barrier coating implementations.

Figure 12:
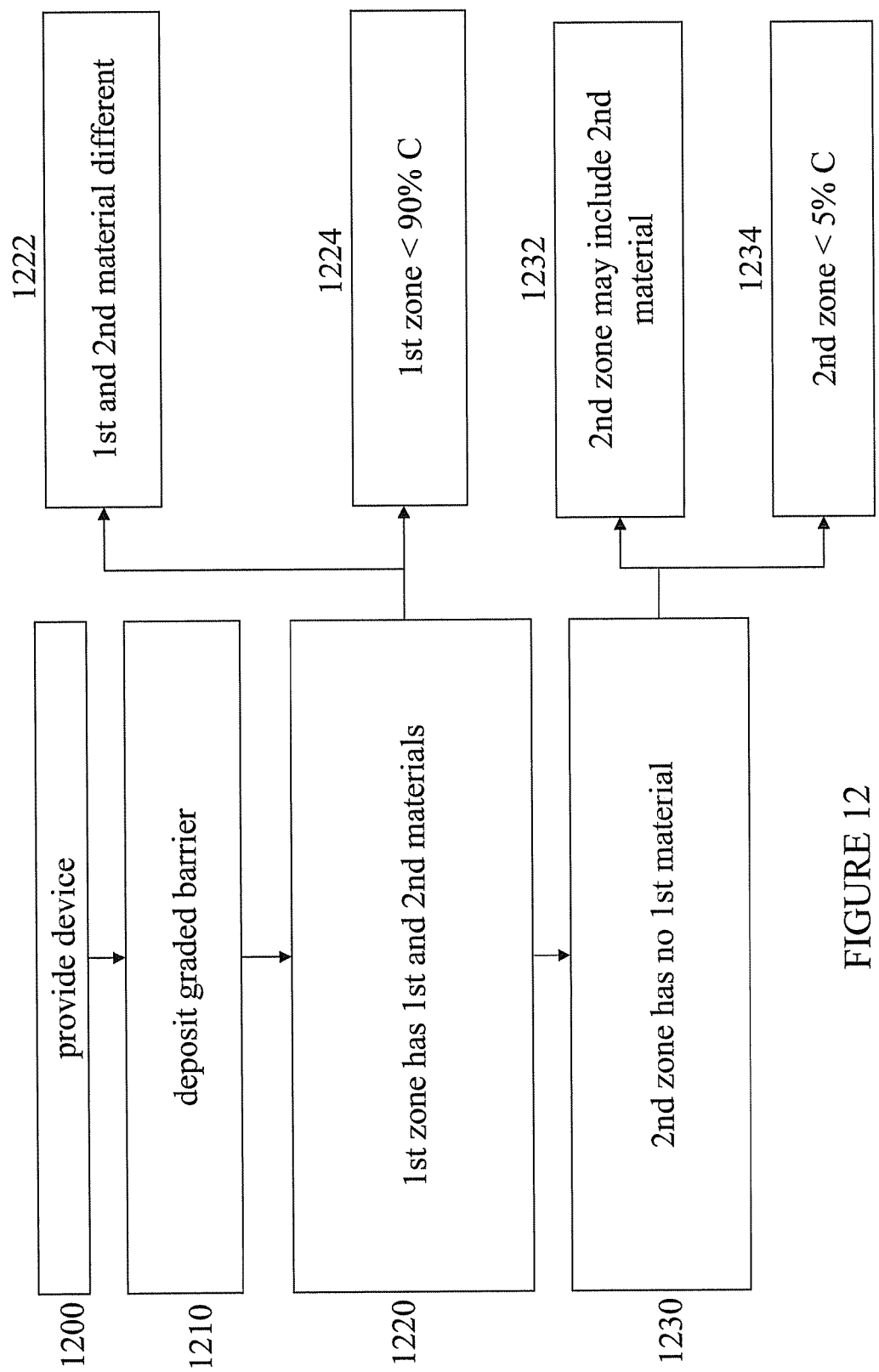
FIG. 12 is a flow chart according to an embodiment of the present invention.
Figure 27:
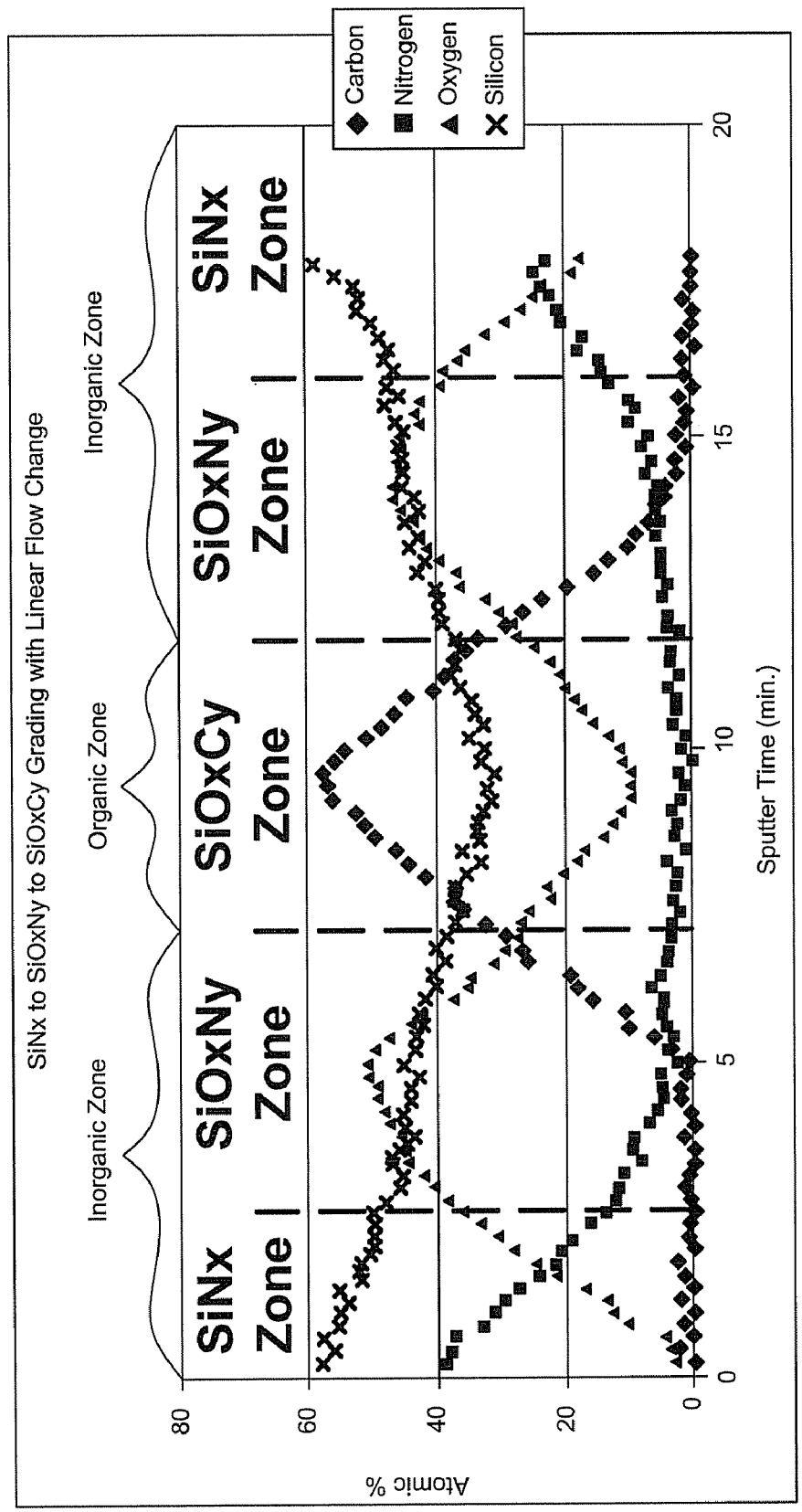
FIG. 27 is an XPS plot for a SiNx, SiOxNy and SiOxCy graded-composition barrier coating according to an embodiment of the present invention.

FIG. 12 is a flow chart representing various alternatives to the embodiment of FIG. 11. In step 1222, the first and second materials may be respectively organic and inorganic; inorganic and organic, inorganic and inorganic; or merely different. As discussed above, the variations are appropriate due to the graded nature of the zones. For example, an inorganic zone may have a varying composition of two different inorganic materials. For example, as shown in FIG. 27, the composition in an inorganic zone may vary between SiOxNy and SiNx. Furthermore, a graded-composition barrier coating according to the present invention may be achieved using grading of different materials that may be categorized in various ways.

In the embodiment illustrated by step 1224, the percent atomic Carbon in the first zone does not exceed 90%. Organic materials may be similarly limited in the first zone. As shown in 1232, the second zone may further comprise the second material. For example, the second zone may be predominantly made of a barrier material, such as an inorganic material. As shown in step 1234, a percent atomic Carbon in the second zone does not exceed approximately 5% in one embodiment.

Deposition Techniques

Figure 13:
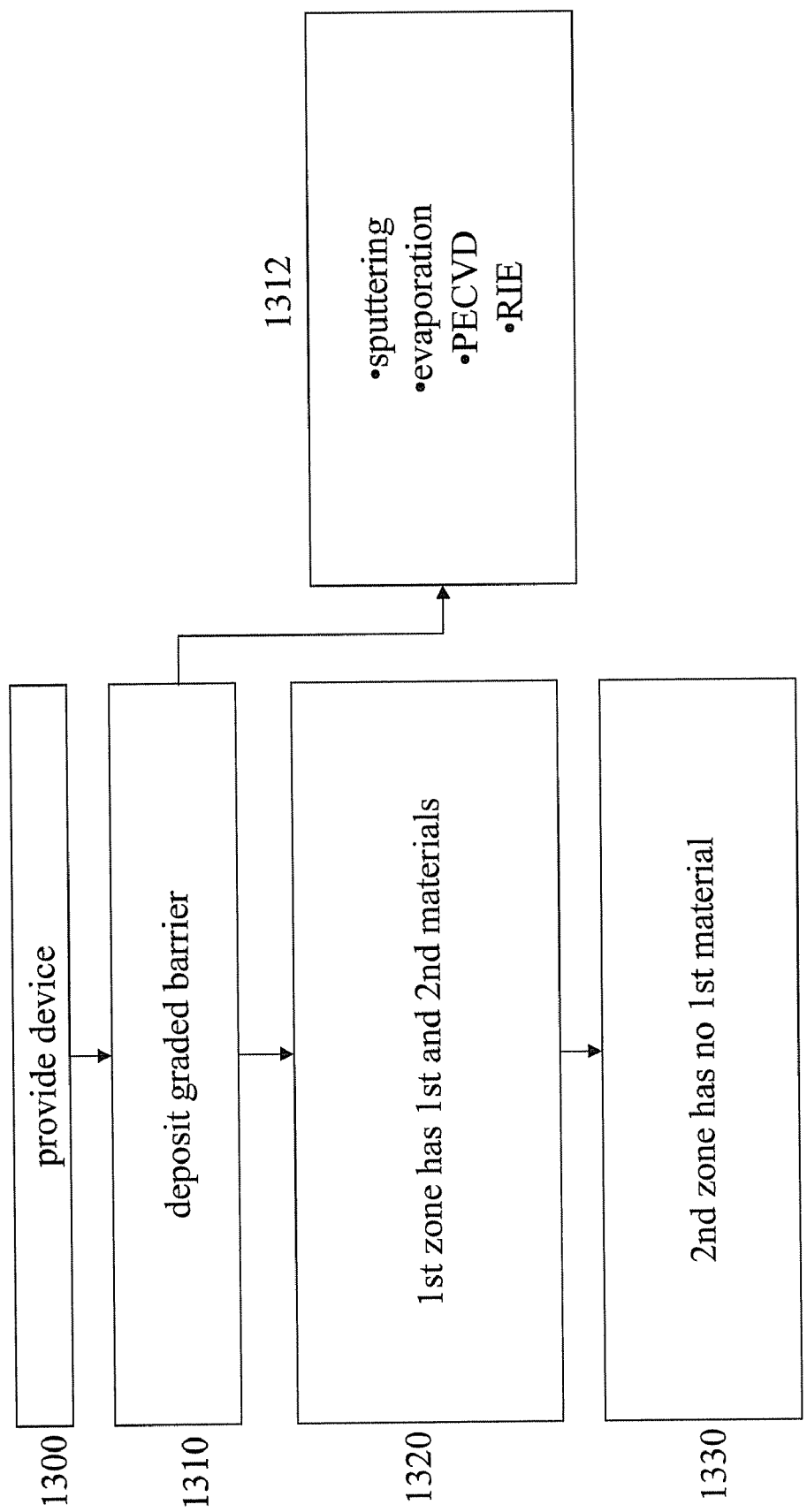
FIG. 13 is a flow chart according to an embodiment of the present invention.

Referring to step 1312 in FIG. 13, various methods of forming a graded-composition barrier coating are described. The coating may be formed by one of many deposition techniques, such as plasma-enhanced chemical-vapor deposition ("PECVD"). As illustrated in FIG. 3, modes such as plasma enhanced ("PE") and reactive ion etching ("RIE") may be preferable methods of making the graded coatings. Power may be applied to the top or bottom of the reactor chamber 51 as appropriate for the mode.

Further techniques may find utility in accordance with the teachings of the present invention. For example, the coating may be formed by radio-frequency plasma-enhanced chemical-vapor deposition ("RFPECVD"), expanding thermal-plasma chemical-vapor deposition ("ETPCVD"), sputtering, reactive sputtering, electron-cyclotron-resonance plasma-enhanced chemical-vapor deposition ("ECRPECVD"), inductively coupled plasma-enhanced chemical-vapor deposition ("ICPECVD"), microwave plasma enhanced chemical vapor deposition, or combinations thereof.

In the ETPCVD technique, the plasma is typically generated at a high pressure compared to the regular PECVD technique.

In the ECRPECVD technique a low pressure is used, typically less than about 0.5 mm Hg, and typically without electrodes. Instead of electrodes, microwave energy generates a discharge. A magnetic field may be used to create the resonance condition of the electron gas, which results in a very high degree of ionization due to electron acceleration at a distance away from the substrate. The low pressure preserves a high number density of free radicals until the plasma reaches the substrate and prevents normally undesirable severe bombardment thereof.

ICPECVD is another electrodeless deposition technique that can create high-density plasma at low pressure. A plasma is generated by an electromagnetic field generated by a concentric induction coil disposed outside one end of the deposition chamber. The substrate is disposed in the deposition chamber at the opposite end. Deposition can typically be carried out at a pressure much less than 0.5 mm Hg.

Optics

Figure 14:
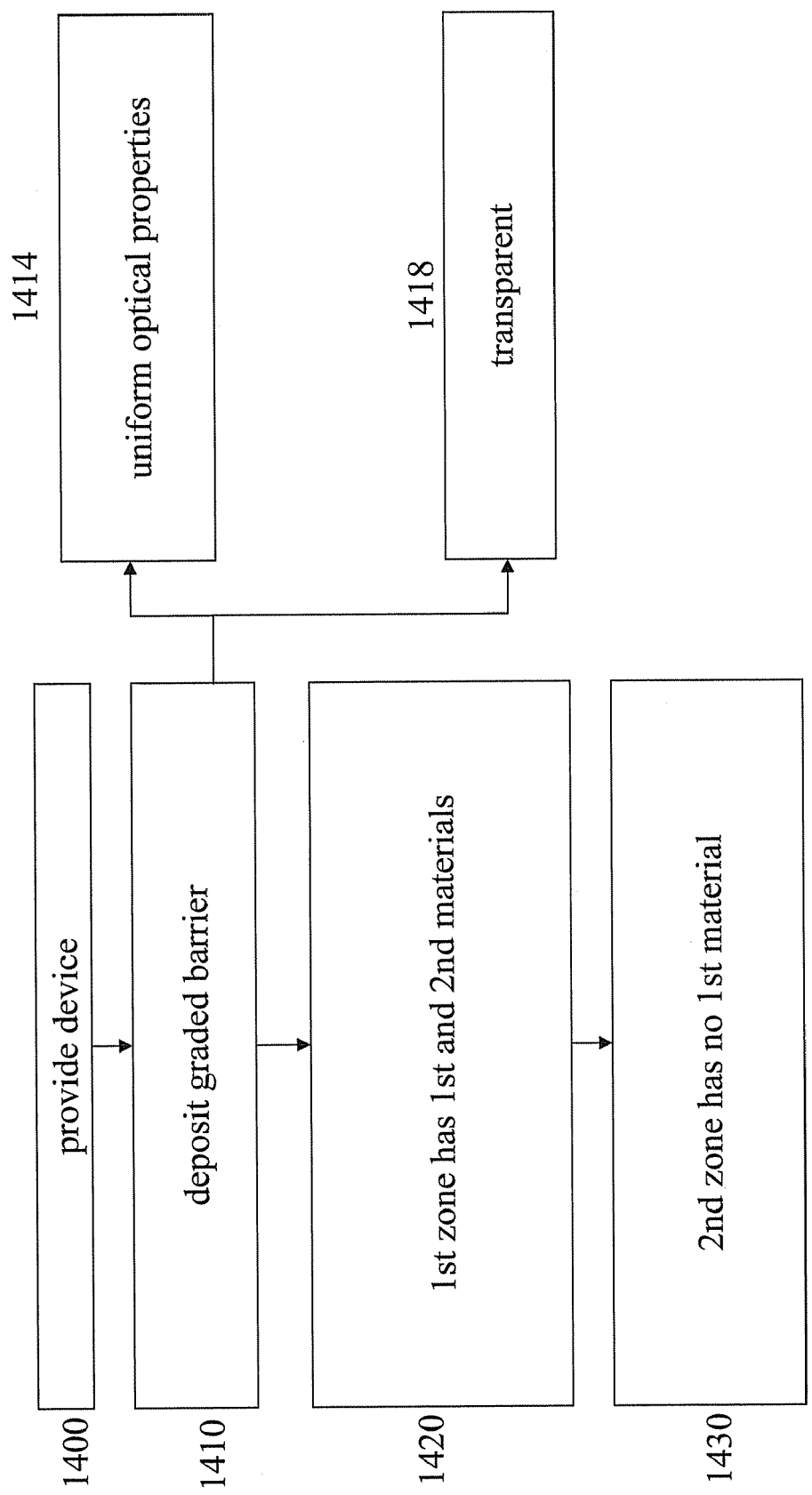
FIG. 14 is a flow chart according to an embodiment of the present invention.

In FIG. 14, optical properties may be achieved by graded-composition barrier coatings of the present invention. In step 1414, the graded-composition barrier coating is formed to have optical properties that are substantially uniform along an axis of light transmission, where the axis is oriented substantially perpendicular to the surface of the coating.

Here, "substantially perpendicular" means within about 15 degrees either side of a perpendicular to a tangent drawn at any point on the surface. In a preferred embodiment, the substantially uniform optical properties provides for a coating with a substantially uniform refractive index. "Substantially uniform refractive index" means the refractive index of any zone in the coating is within about 10% of any other zone in the coating for a selected wavelength. The graded-composition barrier coating preserves color neutrality by exhibiting substantially uniform light transmission. "Substantially uniform light transmission" means at any selected wavelength in a selected wavelength range, the transmission is within about 10% of the average light transmission for the wavelength range, in other words, the barrier coating does not substantially differentially attenuate wavelengths within the selected wavelength range.

The optical losses due to interference resulting from differing refractive indices of the zones of various compositions may be overcome by depositing substantially uniform refractive-index materials. The desired transmission may be achieved by matching the refractive indices of zones in the coating.

In step 1418, the graded-composition barrier coating may be formed to be substantially transparent. In optoelectronic devices one performance parameter is optical efficiency. Therefore it is desirable in certain embodiments that a coating does not overly compromise the optical efficiency due to light absorption or other factors. Therefore, in one embodiment, it may be important that barrier coatings be substantially transparent. The term "substantially transparent" means allowing a total transmission of at least about 50 percent, preferably at least about 80 percent, and more preferably at least 90 percent, of light in a selected wavelength range. The selected wavelength range can be in the visible region, the infrared region, the ultraviolet region or combinations thereof. In certain aspects, graded-composition barrier coatings as taught herein allow for thinner coatings, whereby transparency may be improved.

Figure 15:
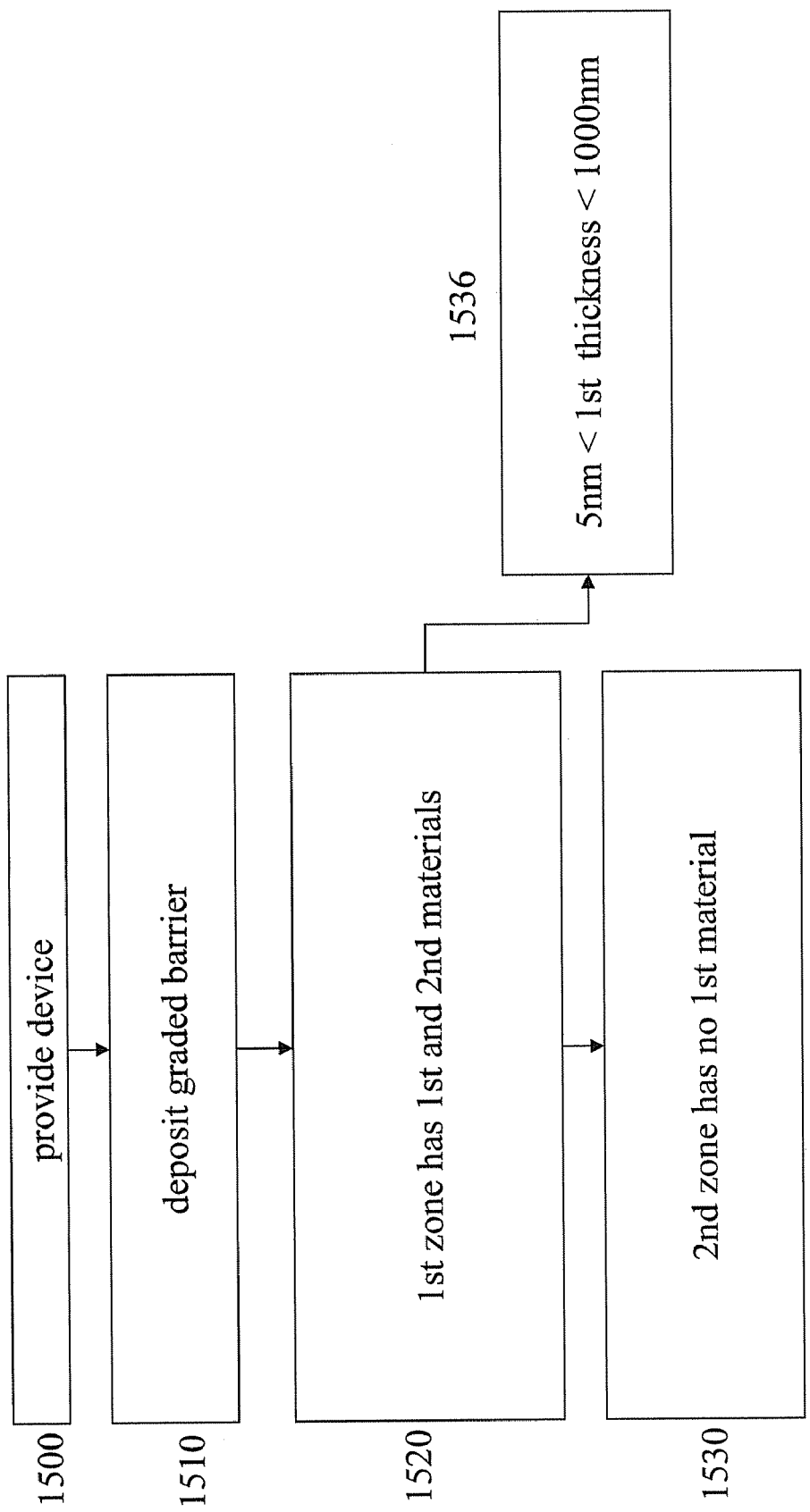
FIG. 15 is a flow chart according to an embodiment of the present invention.

In step 1536 of FIG. 15, an embodiment of a graded-composition barrier coating has a first zone 1520 with thickness between approximately 5 and 1000 nm. As discussed above, a graded-composition barrier coating of reduced thickness may be achieved by continuously changing the composition of the first zone.

Figure 16:
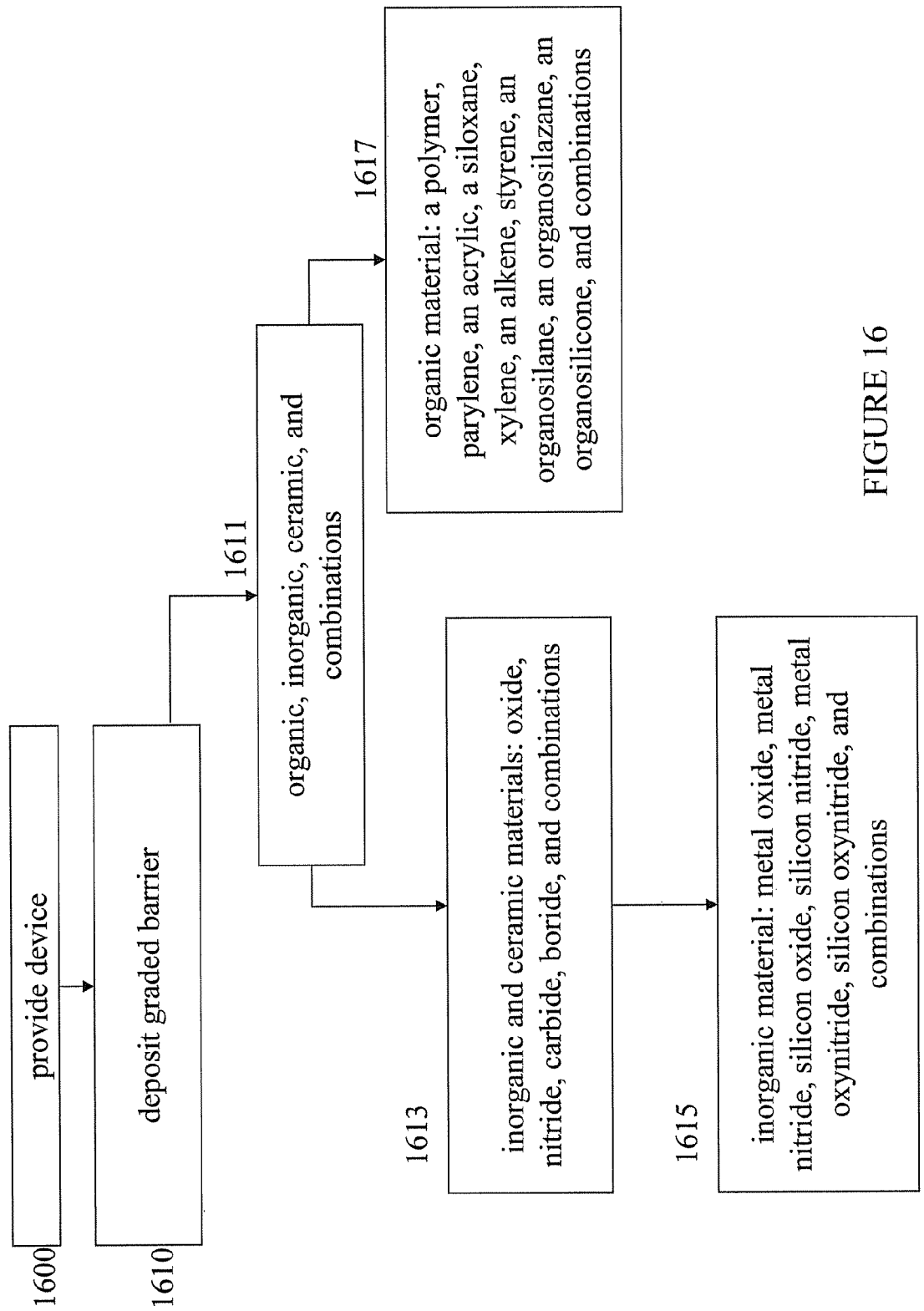
FIG. 16 is a flow chart according to an embodiment of the present invention.

Referring to FIG. 16, various materials are suitable for a graded-composition barrier coating of the present invention. In step 1611, suitable coating compositions include organic, inorganic, or ceramic materials. These materials are typically reaction or recombination products of reacting plasma species and are deposited onto a substrate surface or directly onto a device.

In step 1617, the organic material may be a polymer, an acrylic, a siloxane, xylene, an alkene, styrene, an organosilane, an organosilazane, an organosilicone, and combinations thereof. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms.

In step 1613, the inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals. In step 1615, the inorganic materials may further be metal oxide, metal nitride, silicon oxide, silicon nitride, metal oxynitride, silicon oxynitride, and combinations thereof.

Figure 17:
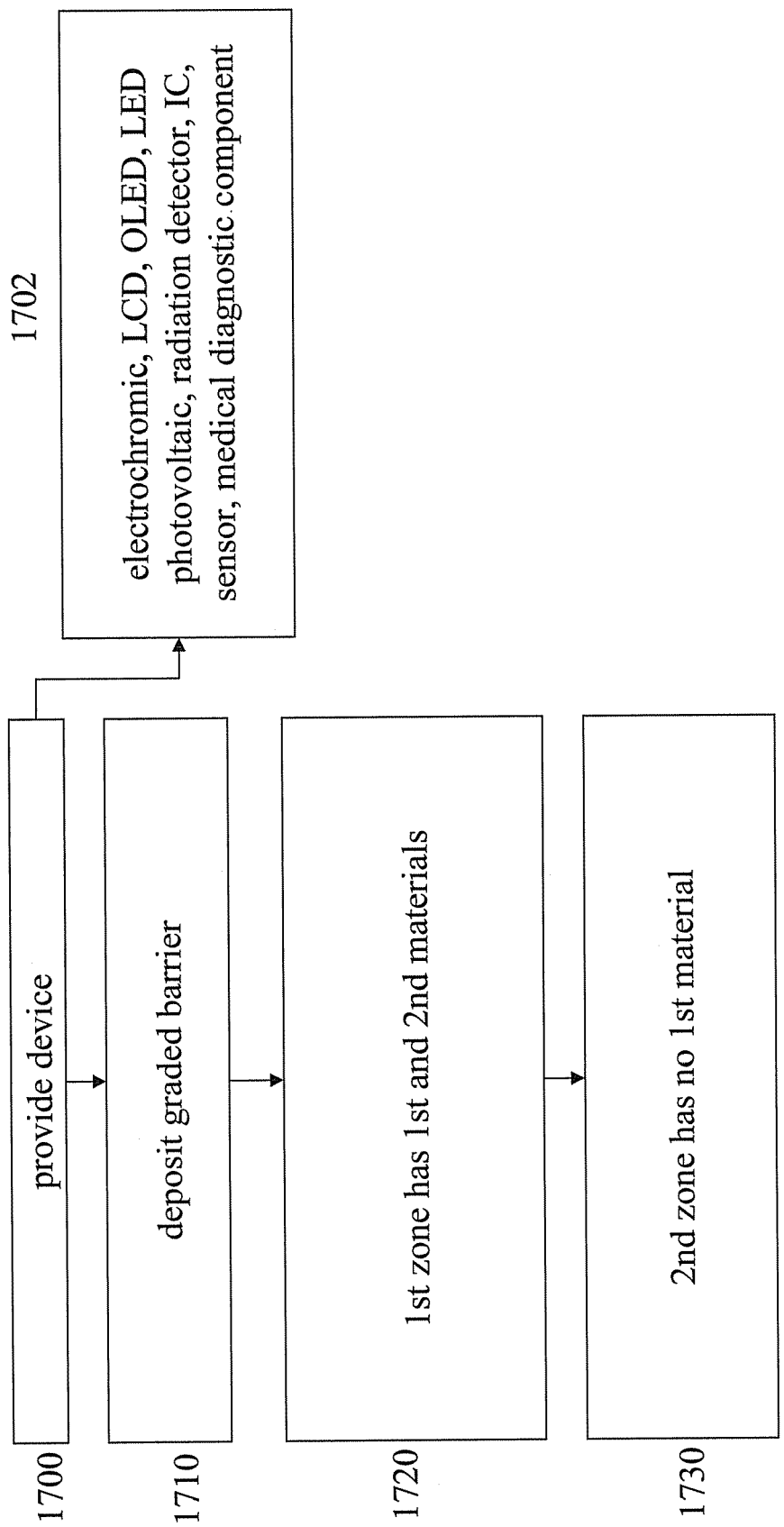
FIG. 17 is a flow chart according to an embodiment of the present invention.

FIG. 17 identifies various embodiments of the device in step 1702. The device may be an electrochromic device, a liquid crystal display, an organic light emitting diode, a light emitting diode, a photovoltaic device, a radiation detector, an integrated circuit, a sensor, a component of a medical diagnostic system and combinations thereof. "Organic light emitting diode" should be taken to include organic electroluminescence devices.

Figure 18:
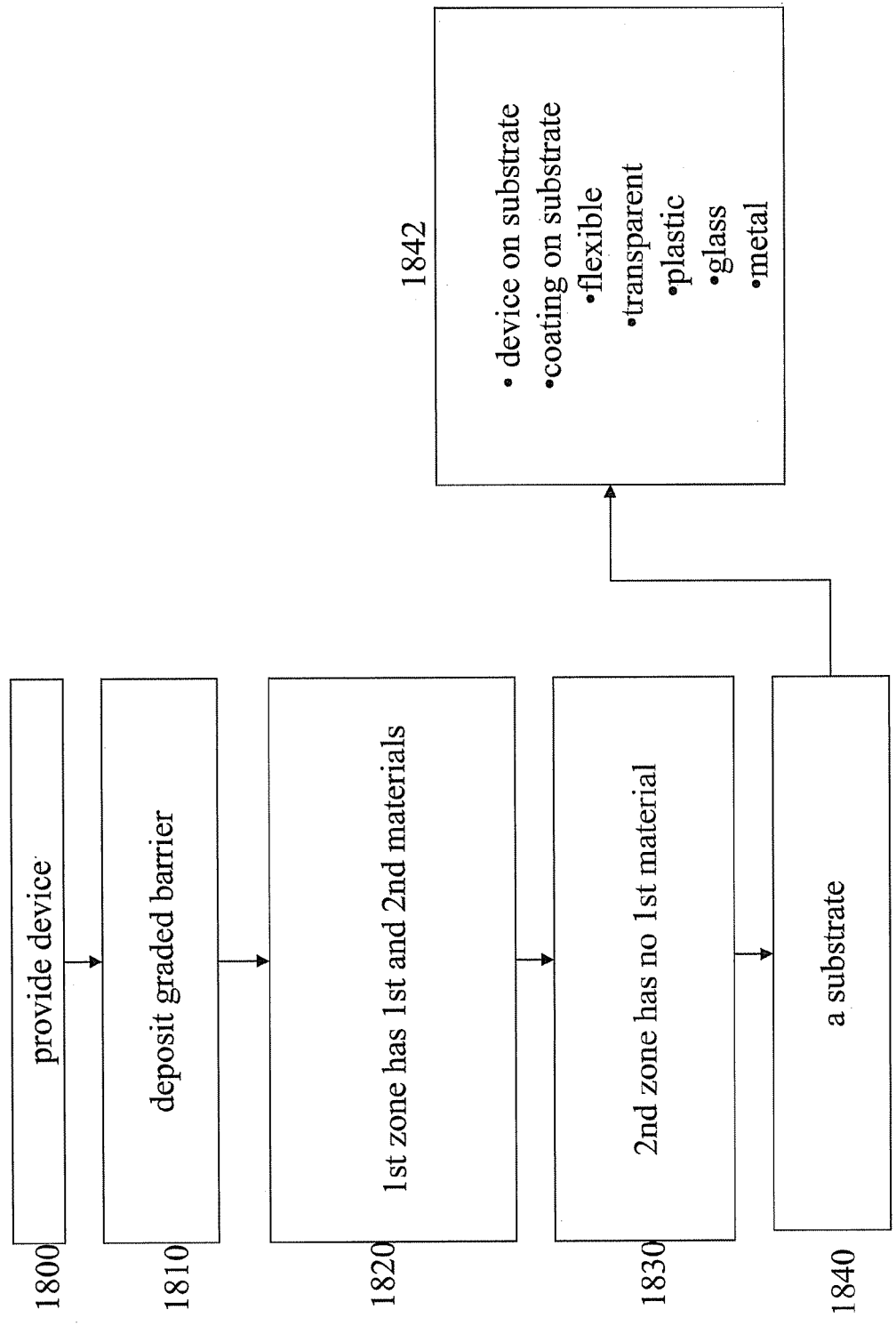
FIG. 18 is a flow chart according to an embodiment of the present invention.

FIG. 18 illustrates certain embodiments where the graded-composition barrier coating may be used in conjunction with a substrate 1840. In step 1842, the substrate may be a substrate upon which the device is disposed. Alternatively, the coating may be disposed on the substrate. The substrate may be substantially flexible, substantially transparent, plastic, glass or metal. The substrate may preferably be plastic, glass, or metal. The graded-composition barrier coating may be used to encapsulate the device alone or in combination the substrate. The graded-composition barrier coatings and substrates described here may be part of a full device such as an OLED display. Such a graded-composition barrier coated substrate finds use in providing protection to many devices or components; e.g., electronic devices, that are susceptible to reactive chemical species normally encountered in the environment. In another example, such a substrate or film having a graded-composition barrier coating may advantageously be used in packaging of materials that corrode or degrade by chemical or biological agents normally existing in the environment. The term "device" as used herein is intended to encompass all of these variations, as appropriate in a given context. Portions of the device, substrate and graded-composition barrier coating may be rigid or flexible. The flexibility of the device may be determined in part by the thickness of the graded-composition barrier coating and its resistance to delamination.

It may further be desired to choose a coating thickness that does not impede the transmission of light through the substrate. Such a graded-composition barrier coated substrate finds use in providing protection to many devices or components; e.g., electronic devices, that are susceptible to reactive chemical species normally encountered in the environment. In another example, such a substrate or film having a graded-composition barrier coating may advantageously be used in packaging of materials that corrode or degrade by chemical or biological agents normally existing in the environment. The term "device" as used herein is intended to encompass all of these variations, as appropriate in a given context.

Examples of substrate materials that may benefit from having a graded-composition transmission-barrier coating are organic polymeric materials, which may be substantially transparent. The materials may optionally be electrically insulating. Suitable polymerics include polyethyleneterephthalate ("PET"); polyacrylates; polycarbonate; silicone; epoxy resins; silicone-functionalized epoxy resins; polyester such as Mylar (made by E. I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES"), (made by Sumitomo); polyetherimide such as Ultem (made by General Electric Company); polyethylenenaphthalene ("PEN"); polynorbonenes; and poly(cyclic olefins). Further examples include polyacrylates such as polymers or copolymers of acrylic acid, methacrylic acid, esters of these acids, or acylonitrile; poly(vinyl fluoride); poly(vinylidene chloride); poly(vinyl alcohol); copolymer of vinyl alcohol and glyoxal (also known as ethanedial or oxaaldehyde); polyethyleneterephthalate, parylene (thermoplastic polymer based on p-xylene), and polymers derived from cycloolefins and their derivatives (such as poly(arylcyclobutene) disclosed in U.S. Pat. Nos. 4,540,763 and 5,185,391 which are incorporated herein by reference.

A plastic substrate coated with a graded-composition coating, which is formed by any method disclosed above can be advantageously used to produce flexible light sources based on organic light-emitting materials. The term "flexible" means being capable of being bent into a shape having a radius of curvature of less than about 100 cm. The term "substantially transparent" means allowing a total transmission of at least about 50 percent, preferably at least about 80 percent, and more preferably at least 90 percent, of light in a selected wavelength range. Preferably, the selected wavelength range is the visible range, i.e., about 400 nm to about 700 nm.

Figure 19:
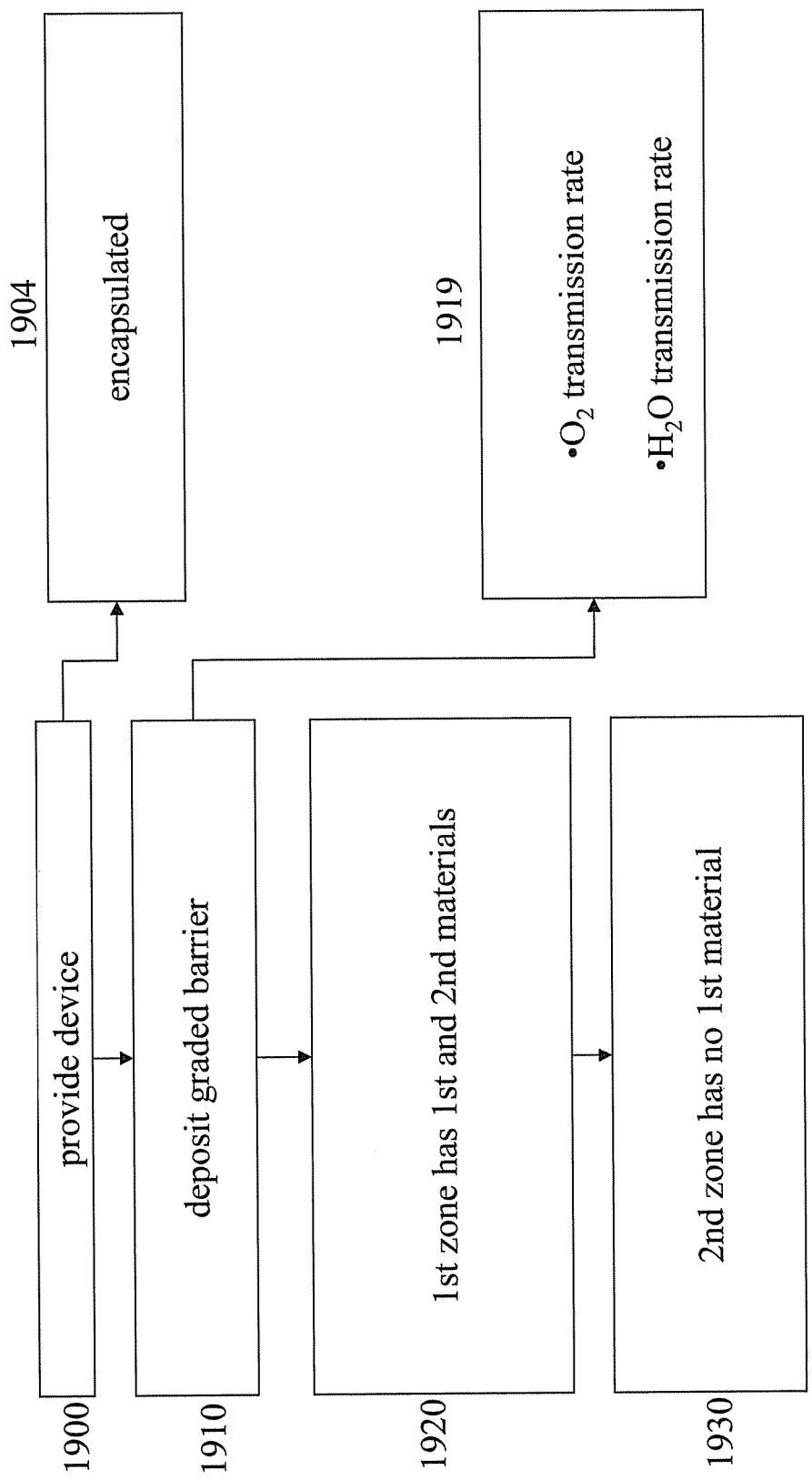
FIG. 19 is a flow chart according to an embodiment of the present invention.

In FIG. 19, embodiments of the graded-composition barrier coating have a structure achieving a high performance as a barrier. In step 1904, the device may be encapsulated by the graded-composition barrier coating or by the graded-composition barrier coating and a substrate. In step 1919, the coating may have an $O_2$ transmission rate less than approximately 0.01 $cm^3/(m^2$ day), at 25° C. with a gas containing approximately 21 vol. % $O_2$. The $H_2O$ transmission rate may be less than approx 0.0001 $g/(m^2$ day), at 25° C. with a gas having approximately 100% relative humidity. Certain graded-composition barrier coatings of the present invention may achieve higher barrier performance criteria. For example, graded-composition barrier coatings described herein are suitable for producing robust OLED devices where the coatings have an oxygen transmission rate less than approximately 0.001 $cm^3/(m^2$ day) with a water vapor transmission rate less than approximately 0.000001 $g/(m^2$ day).

Figure 20:
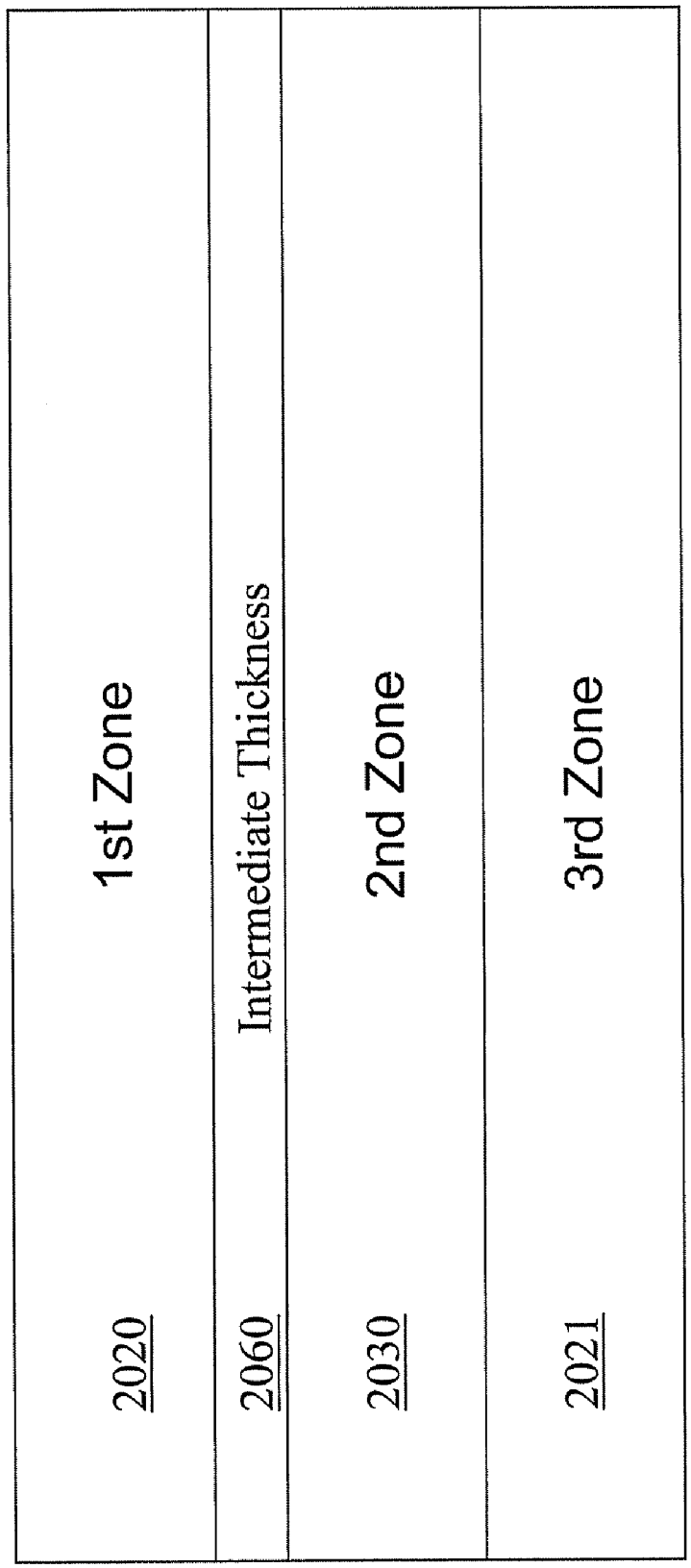
FIG. 20 is a schematic cross-sectional view of a graded-composition barrier coating according to an embodiment of the present invention.

The demarcation of zones in all of the figures are identified for illustrative purposes only, and one of ordinary skill will appreciate that further intermediate areas or zones may be present. For example, FIG. 20 shows a cross-section of a graded-composition barrier coating having first zone 2020 separated from second zone 2030 by an intermediate thickness 2060, whereas second zone 2030 is contiguous to third zone 2021. Intermediate thickness 2060 may be a transition area, may be a distinct zone, or may comprise further materials. The embodiment exemplified by a particular figure should not be limited to the particular demarcation of zones illustrated, nor should the meaning of the term "zone" be limited to an example shown in a figure.

In FIGS. 21 to 23, graded-composition barrier coatings are shown in various physical configurations. In FIG. 21, the graded-composition barrier coating is disposed in between the device and the substrate. In one embodiment, the substrate in this configuration may preferably be plastic with the graded-composition barrier coating enhancing the barrier performance of the plastic. The grading and material selection for such a graded-composition barrier coating may preferably be flexible. In FIG. 22, the graded-composition barrier coating and the substrate encapsulate the device. The substrate in this configuration may preferably be glass or metal foil. If the substrate is metal foil, the graded-composition barrier coating may preferably be optimized for optical performance. In FIG. 23, the graded-composition barrier coating completely encapsulates the device. In this configuration, the substrate may preferably be plastic. The various configurations may be adapted to meet the needs of a given device, for example, rigid or flexible or a certain transmission need. One of ordinary skill in the art will appreciate that intermediate layers (not shown) may be present in a particular embodiment without departing from the structures shown and claimed. For example, an adhesive may preferably be disposed between the device and the substrate or the barrier. One of ordinary skill will appreciate that further combinations are advantageously obtainable while performing as a barrier in accordance with the teachings herein.

Figure 24:
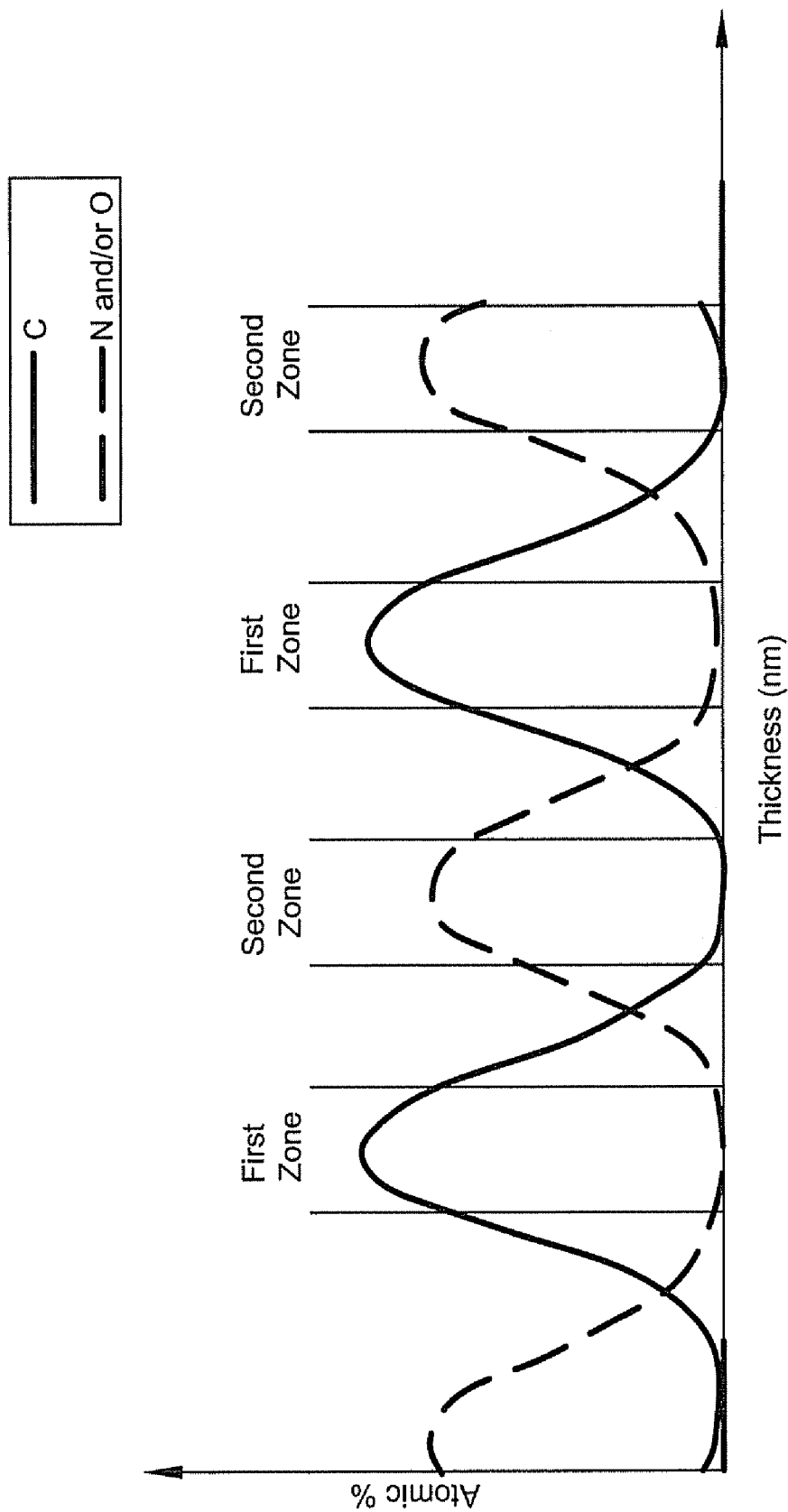
FIG. 24 is a graph of a graded-composition barrier according to an embodiment of the present invention.

In FIG. 24, another aspect of the present invention is illustrated. As shown, the first and second zones each have a composition that varies substantially continuously across its thickness. For example, in the first zone, a first percent atomic C varies substantially continuously and is greater than a first percent atomic N and/or O. In the second zone, a second percent atomic N and/or O varies substantially continuously and is greater than a second percent atomic C. As shown, the resulting composition is substantially wave like, having upper peaks and lower valley portions. The lower valleys may preferably level off around a low minimum value. One of skill in the art will appreciate that the wave like shape of the composition need not be repeated from one zone to the next along the thickness of a given graded-composition barrier coating.

Figure 25:
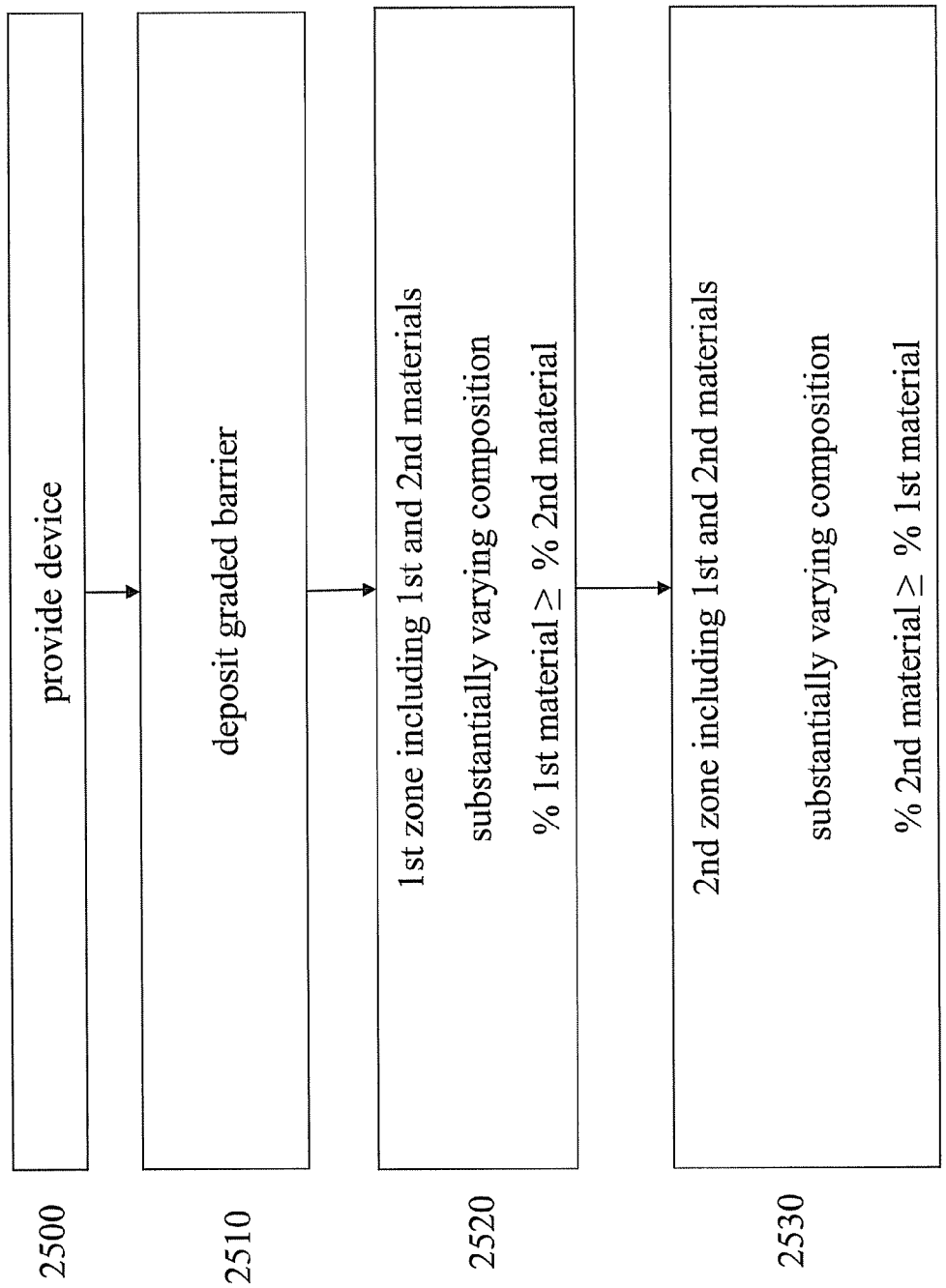
FIG. 25 is a flow chart according to an embodiment of the present invention.

FIG. 25 shows method steps for making a graded-composition barrier coating like the one in FIG. 24. A shown, in step 2500, a device having a surface is provided. In step 2510, a graded-composition barrier coating is deposited on the surface of the device. The graded-composition barrier coating has a first zone described in step 2520 and a second zone described in step 2530. In 2520, the 1st zone is defined by a 1st thickness comprising a 1st material and a 2nd material wherein a composition of the 1st zone varies substantially continuously across the 1st thickness and wherein a 1st percent composition of the 1st material is greater than or equal to a 1st percent composition of the 2nd material. In 2530, the 2nd zone is defined by a 2nd thickness comprising the 1st material and the 2nd material wherein a composition of the 2nd zone varies substantially continuously across the 2nd thickness and wherein a 2nd percent composition of the 2nd material is greater than or equal to a 2nd percent composition of the 1st material. Specific non-limiting examples of such a structure will now be described.

Figure 26:
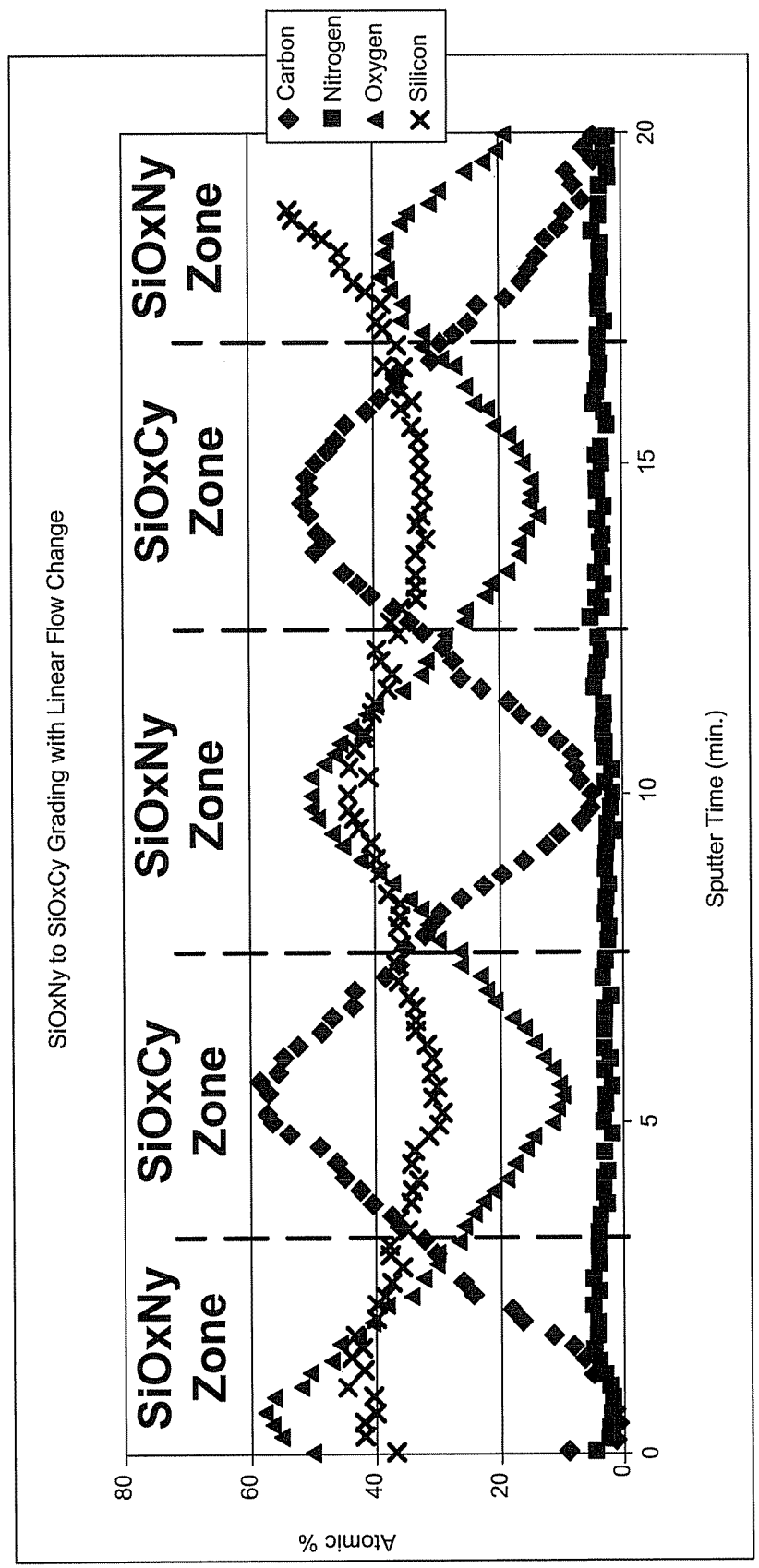
FIG. 26 is an XPS plot for a SiOxNy and SiOxCy graded-composition barrier coating according to an embodiment of the present invention.

Referring to FIG. 26, an XPS depth profile depicts a graded-composition barrier coating having a plurality of SiOxNy zones with intermediate SiOxCy zones. As stated earlier, the zone demarcations in the figures are shown for illustrative purposes only. As will be appreciated, the demarcation of the zones in FIG. 26 could have been drawn as non-contiguous. As shown, the composition of the SiOxNy zone varies substantially continuously and the percent composition of SiOxNy is greater than SiOxCy. In a SiOxCy zone, SiOxCy and SiOxNy are present. The composition of the SiOxCy zone varies substantially continuously and the percent composition of SiOxCy is greater than SiOxNy. The SiOxNy zones provides superior barrier properties and the transitions to the SiOxCy zones were established using the findings in FIG. 5 as a basis. Across most of the graded-composition barrier coating, percent atomic Silicon and Oxygen vary substantially sinusoidally in phase with different magnitudes. The percent atomic Carbon varies substantially sinusoidally 180 degrees out of phase with the Silicon and Oxygen. Nitrogen is maintained at a low level, approximately 5%, across the thickness of the graded-composition barrier coating. Silicon increases to a maximum towards the maximum coating thickness.

Referring to FIG. 27, an XPS depth profile depicts a graded-composition barrier coating having a plurality of SiOxNy zones, SiNx zones, and a SiOxCy zone. This is an example of a graded-composition barrier coating that has three materials, and can be characterized as having three zones (SiOxNy, SiNx, and SiOxCy). Alternatively, the coating may be characterized as having two zones, organic and inorganic. These and further combinations are within the scope of the present invention. This graded-composition barrier coating is SiNx based with SiNx to SiOxNy to SiOxCy grading. One will appreciate that earlier descriptions of a first and second zone with respect to FIG. 25 can be read on the XPS depth profile of FIG. 27. As shown, Silicon, Nitrogen and Oxygen vary substantially continuously across the coating. Carbon, however, varies substantially continuously only between 5 and 15 minutes of sputtering. Zones shown before and after those times are substantially SiOxCy free.

Multiple advantages can be realized by one or more of the embodiments of the present invention. In one embodiment, barrier enhancements were achieved by making graded-composition barrier coatings without a monotonous composition of organic material. A graded-composition barrier coating was described with a first zone, for example an organic zone, having a continuously changing composition. In a further aspect, a second zone had a composition that continuously varied. Barrier enhancements were achieved in the examples of a fully graded SiOxCy zone. Better control of gradation has been achieved by using XPS to map film composition to precursor gas flows thus allowing automatic programmed control of the rate of supplying precursors into a process chamber. The resulting improvements in graded-composition barrier coatings include properties such as thickness, flexibility, adhesion, optics, barrier, and reductions in tact time.

While preferred embodiments of the present invention have been described in detail, it is to be understood that the embodiments described are illustrative only. From this specification, those skilled in the art will appreciate numerous and varied other embodiments within the spirit and scope of the invention. The scope of the invention is to be defined not by the preferred embodiments, but solely by the appended claims and equivalents thereof.

What is claimed is:

1. A method of forming a barrier coating, the method comprising:
    providing a device having a surface; and
    depositing on said surface a graded-composition barrier coating comprising:
        a first zone defined by a first thickness comprising a first material and a second material wherein a composition of said first zone varies substantially continuously across said first thickness; and
        a second zone defined by a second thickness which is substantially free of any of said first material; and,
    wherein said coating is deposited using a method selected from the group consisting of: sputtering, reactive sputtering, evaporation, plasma-enhanced chemical vapor deposition, reactive ion etching plasma-enhanced chemical vapor deposition, radio-frequency plasma-enhanced chemical-vapor deposition, expanding thermal plasma chemical-vapor deposition, electron-cyclotron-resonance plasma-enhanced chemical-vapor deposition, inductively-coupled plasma-enhanced chemical-vapor deposition, and combinations thereof.

2. The method of claim 1, wherein said first material is organic and second material is inorganic.

3. The method of claim 1, Wherein said first material and said second material are each inorganic.

4. The method of claim 1, wherein a percent atomic Carbon in said first zone does not exceed approximately 90%.

5. The method of claim 1, wherein a percent atomic Carbon in said second zone does not exceed approximately 5%.

6. The method of claim 1, wherein said coating has optical properties that are substantially uniform along an axis of light transmission, said axis oriented substantially perpendicular to the surface of the coating.

7. The method of claim 1, wherein said first thickness is between approximately 5 nm and approximately 1000 nm.

8. The method of claim 1, wherein said coating comprises a material selected from a group consisting of: organic, inorganic, ceramic, and combinations thereof.

9. The method of claim 8 wherein the inorganic and ceramic materials are selected from the groups consisting of: oxide, nitride, carbide, boride, and combinations thereof of elements of Group IIA, IIIA, IVA, VA, VIA, VIIA, IB, and IIB, metals of group IIIB, IVB, and VB, and rare-earth metals.

10. The method of claim 8, wherein said organic material comprises a material selected from the group consisting of: a polymer, parylene, an acrylic, a siloxane, xylene, an alkene, styrene, an organosilane, an organsilazane, an organosilicone, and combinations thereof.

11. The method of claim 8, wherein the organic material comprises material from the group consisting of: metal oxide, metal nitride, silicon oxide, silicon nitride, metal oxynitride, silicon oxynitride, and combinations thereof.

12. The method of claim 1, wherein said coating is substantially transparent.

13. The method of claim 1, wherein said device is selected from the group consisting of: an electrochromic device, a liquid crystal display, an organic light emitting diode, a light emitting diode, a photovoltaic device, a radiation detector, an integrated circuit, a sensor, a component of a medical diagnostic system and combinations thereof.

14. The method of claim 1 further comprising a substrate upon which said device is disposed.

15. The method of claim 14, wherein said substrate is substantially flexible.

16. The method of claim 14, wherein said substrate is substantially transparent.

17. The method of claim 14, wherein said substrate comprises a material selected from the group consisting of: plastics, glass, and metal.

18. The method of claim 1 further comprising a substrate upon which said coating is disposed.

19. The method of claim 1, wherein said device is encapsulated by said coating or by said coating and a substrate.

20. The method of claim 1, wherein said coating has an oxygen transmission rate less than approximately 0.01 $cm^3/(m^2\ day)$ as measured at 25° C. with gas having approximately 21 volume-percent oxygen.

21. The method of claim 1, wherein said coating has a water vapor transmission rate less than approximately 0.0001 $g/(m^2\ day)$, as measured at 25° C. with gas having approximately 100-percent relative humidity.

22. The method of claim 1, wherein said first zone and said second zone are contiguous.

23. A method of framing a barrier coating, the method comprising:
providing a substrate;
providing an electronic device disposed on said substrate; and
depositing on said electronic device via plasma-enhanced chemical-vapor deposition a graded-composition barrier coating which is substantially transparent to visible light, wherein said coating comprises:
a first zone defined by a first thickness in which a composition of an inorganic material and a composition of an organic material each vary substantially continuously across said first thickness and wherein said first thickness is between approximately 5 nm and approximately 1000 nm; and
a second zone defined by a second thickness which is substantially free of any organic material.

24. The method of claim 23, wherein said coating has an oxygen transmission rate less than approximately 0.01 $cm^3/(m^2\ day)$ as measured at 25° C. with gas having approximately 21 volume-percent oxygen and wherein said coating has a water vapor transmission rate less than approximately 0.0001 $g/(m^2\ day)$, as measured at 25° C. with gas having approximately 100-percent relative humidity.

25. The method of claim 24 wherein said coating has optical properties that are substantially uniform along an axis of light transmission, said axis oriented substantially perpendicular to the surface of the coating.

26. The method of claim 24 wherein said coating comprises a material selected from the group consisting of: organic, inorganic, ceramic, and combinations thereof.

27. The method of claim 24, wherein said device is selected from the group consisting of: an electrochromic device, a liquid crystal display, an organic light emitting diode, a light emitting diode, a photovoltaic device, a radiation detector, an integrated circuit, a sensor, a component of a medical diagnostic system and combinations thereof.

28. The method of claim 24, wherein said substrate is substantially flexible.

29. The method of claim 24, wherein said substrate is substantially transparent.

30. The method of claim 24, wherein said device is encapsulated by said coating or by said coating and said substrate.

31. The method of claim 24, wherein said first zone and said second zone are contiguous.

* * * * *